(12) United States Patent
Umeki

(10) Patent No.: US 10,069,017 B2
(45) Date of Patent: Sep. 4, 2018

(54) DIODE

(71) Applicant: ROHM CO., LTD., Kyoto-shi, Kyoto (JP)

(72) Inventor: Shinya Umeki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 18 days.

(21) Appl. No.: 15/468,803

(22) Filed: Mar. 24, 2017

(65) Prior Publication Data

US 2017/0278982 A1    Sep. 28, 2017

(30) Foreign Application Priority Data

Mar. 28, 2016 (JP) ................. 2016-064021

(51) Int. Cl.

| | |
|---|---|
| H01L 29/66 | (2006.01) |
| H01L 29/87 | (2006.01) |
| H01L 29/06 | (2006.01) |
| H01L 29/40 | (2006.01) |
| H01L 29/861 | (2006.01) |
| H01L 29/16 | (2006.01) |
| H01L 29/36 | (2006.01) |

(52) U.S. Cl.
CPC .......... *H01L 29/87* (2013.01); *H01L 29/0615* (2013.01); *H01L 29/0619* (2013.01); *H01L 29/0623* (2013.01); *H01L 29/0688* (2013.01); *H01L 29/0692* (2013.01); *H01L 29/1608* (2013.01); *H01L 29/404* (2013.01); *H01L 29/8611* (2013.01); *H01L 29/0638* (2013.01); *H01L 29/36* (2013.01)

(58) Field of Classification Search
None
See application file for complete search history.

(56) References Cited

U.S. PATENT DOCUMENTS

| | | | |
|---|---|---|---|
| 2008/0315248 A1 | 12/2008 | Tokura et al. | |
| 2010/0187598 A1* | 7/2010 | Endo | H01L 29/66325 257/329 |
| 2015/0061090 A1* | 3/2015 | Oyama | H01L 29/8611 257/656 |
| 2016/0056306 A1* | 2/2016 | Masuoka | H01L 29/0615 257/483 |
| 2016/0163654 A1* | 6/2016 | Nakanishi | H01L 23/552 257/140 |

FOREIGN PATENT DOCUMENTS

| | | |
|---|---|---|
| JP | 2005183605 | 7/2005 |
| JP | 2007288158 | 11/2007 |
| JP | 2013235890 | 11/2013 |

* cited by examiner

*Primary Examiner* — Calvin Choi
(74) *Attorney, Agent, or Firm* — Hamre, Schumann, Mueller & Larson, P.C.

(57) ABSTRACT

A diode includes an n type semiconductor layer including an n type cathode layer and an n type drift layer that has an impurity concentration lower than the n type cathode layer and that is disposed on the n type cathode layer, a p type anode layer disposed at a surface part of the n type drift layer, a p type hole implantation layer selectively disposed at the n type cathode layer, an anode electrode electrically connected to the p type anode layer, and a cathode electrode electrically connected to the n type cathode layer and to the p type hole implantation layer, and the p type hole implantation layer has a diameter of 20 μm or more.

18 Claims, 23 Drawing Sheets

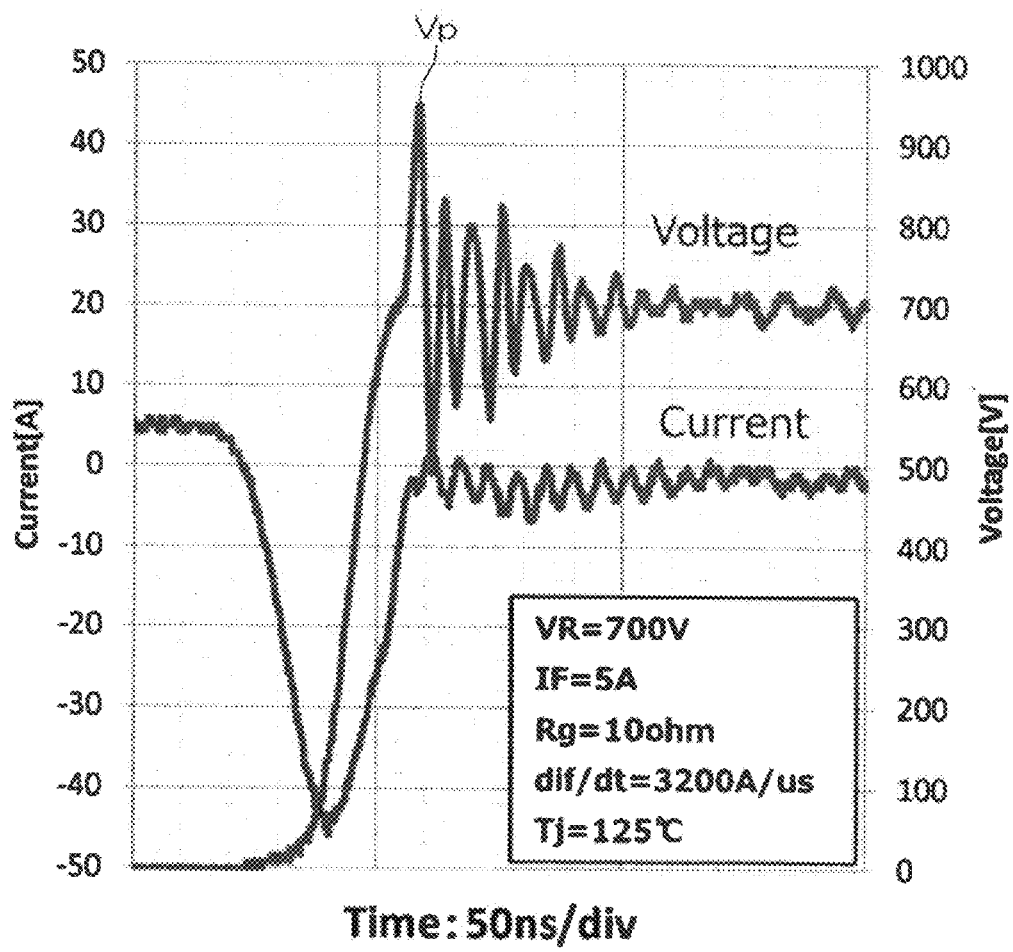

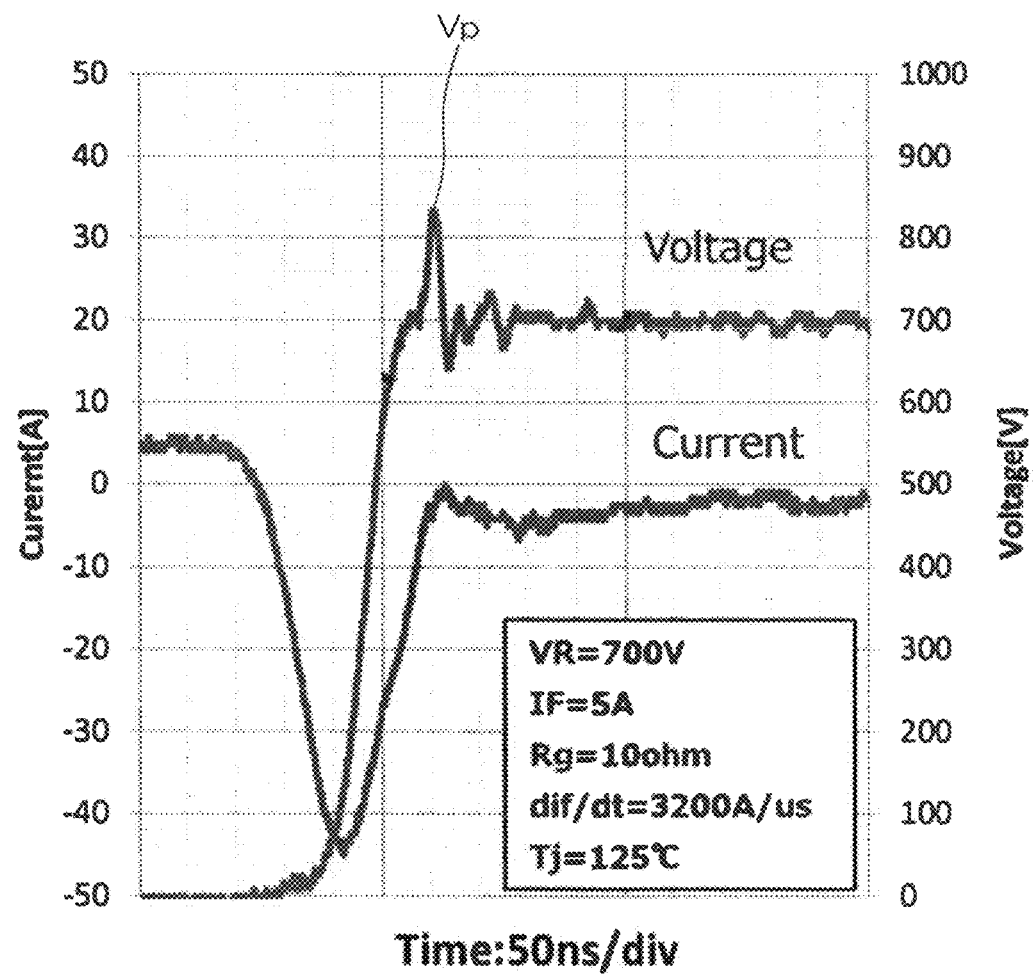
FIG. 19B Example: Reverse surface P layer structure
P layer 20% (Electrons irradiated)

DIODE

CROSS-REFERENCE TO RELATED APPLICATIONS

The present application corresponds to Japanese Patent Application No. 2016-64021 filed in the Japan Patent Office on Mar. 28, 2016, and the entire disclosure of the application is incorporated herein by reference.

TECHNICAL FIELD

The present invention relates to a diode, and in particular to a diode having a short reverse recovery time trr that is called a fast recovery diode (FRD).

BACKGROUND ART

A fast recovery diode is publicly known, and is used for the rectification of a high-frequency power source or the like. Among conventional fast recovery diodes, there are diodes that have realized excellent on-off characteristics by introducing a life time killer by means of electron irradiation in order to shorten a reverse recovery time trr during a switching operation (for example, Japanese Patent Application Publication No. 2005-183605).

SUMMARY OF INVENTION

In a diode, electrons implanted from a cathode into a drift layer during conduction in the forward direction move to a cathode when a switching operation is performed. At this time, if the density of carriers stored in the drift layer is low, the carriers will be rapidly depleted along with the extension of a depletion layer. As a result, a great change in the electric current occurs, thus causing voltage ringing.

As an example of measures thereagainst, it is considered that a small number of carriers are implanted from a p layer during a switching operation (recovery operation) by disposing the p layer at a part of an n layer on the cathode side. In other words, carriers are supplied from the p layer during a recovery operation, and, as a result, it is possible to prevent the carriers from being rapidly depleted, and it is possible to restrain a recovery current from being rapidly changed.

However, there is a possibility that voltage ringing will contrarily become large merely by disposing the p layer, and therefore it is necessary to pay attention to the size or the disposition rate of the p layer with respect to the disposition of the p layer.

It is an object of the present invention to provide a diode that is capable of effectively restraining voltage ringing during a recovery operation.

BRIEF DESCRIPTION OF DRAWINGS

FIG. 19A is a view showing recovery characteristics of a pn diode of a reference example.

FIG. 19B is a view showing recovery characteristics of a pn diode of Example.

DESCRIPTION OF EMBODIMENTS

Figure 1:
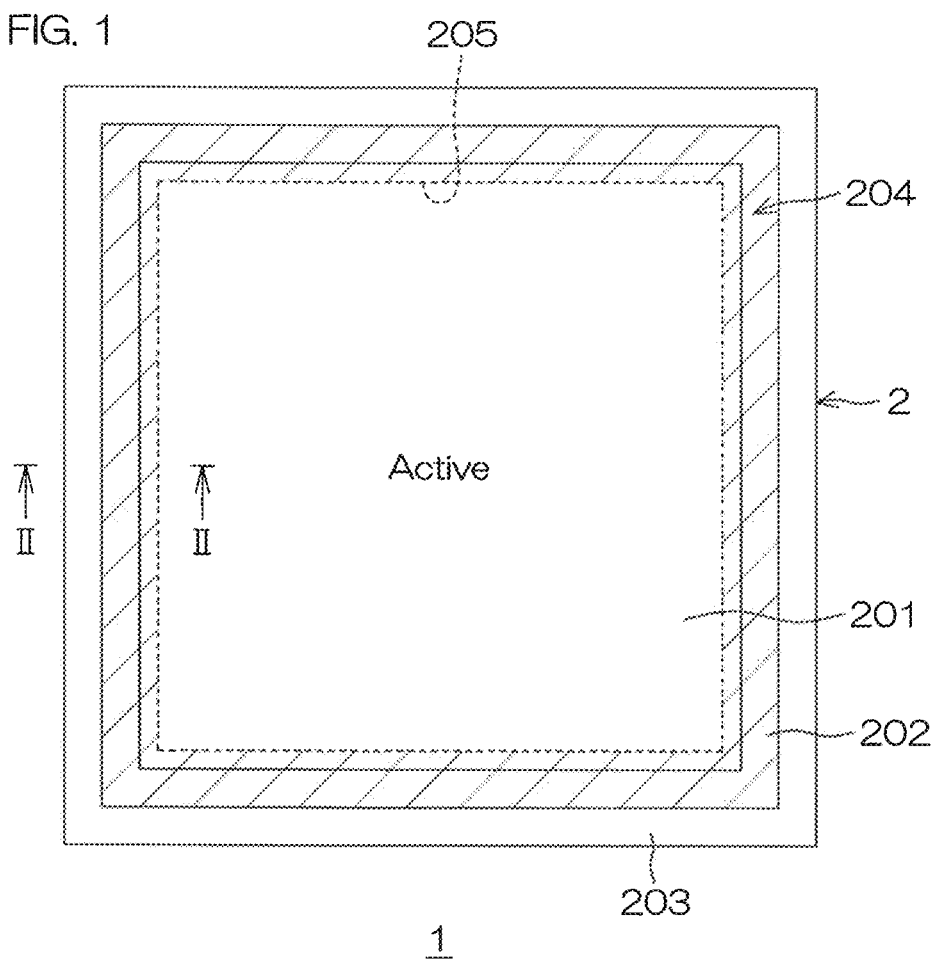
FIG. 1 is a schematic plan view of a pn diode according to a preferred embodiment of the present invention.

A diode according to a preferred embodiment of the present invention includes an n type semiconductor layer including an n type cathode layer and an n type drift layer that is disposed on the n type cathode layer and that has an impurity concentration lower than the n type cathode layer, a p type anode layer disposed at a surface part of the n type drift layer, a p type hole implantation layer selectively disposed at the n type cathode layer, an anode electrode electrically connected to the p type anode layer, and a cathode electrode electrically connected to the n type cathode layer and to the p type hole implantation layer, and the p type hole implantation layer has a diameter of 20 µm or more.

For example, an electron implanted from the n type cathode layer into the n type drift layer when an electric current is conducted in the forward direction moves to the n type cathode layer along the thickness direction of the n type drift layer during a switching operation. At this time, an electron that resides at a position facing the p type hole implantation layer in the n type drift layer moves to a place near the p type hole implantation layer, and then moves on the p type hole implantation layer along the lateral direction, and moves toward the n type cathode layer. Thereafter, when a voltage drop caused by the movement in the lateral direction of the electron becomes higher than a built-in voltage of a pn junction portion between the n type semiconductor layer and the p type hole implantation layer, the electron that is moving in the lateral direction moves to the p type hole implantation layer, and the implantation of holes (positive holes) starts from the p type hole implantation layer.

In this background, in the diode according to one preferred embodiment of the present invention, the diameter of the p type hole implantation layer is 20 μm or more, and therefore it is possible to sufficiently increase a voltage drop caused by the movement along the p type hole implantation layer of electrons. As a result, it is possible to excellently implant holes from the p type hole implantation layer, and hence is possible to prevent the depletion of carriers, and is possible to effectively restrain voltage ringing.

In the diode according to one preferred embodiment of the present invention, the disposition rate of the p type hole implantation layer, which is calculated by (total area of the p type hole implantation layer)/(total area of a surface on which the p type hole implantation layer is formed)×100 (%), may be 20% or more.

In the diode according to one preferred embodiment of the present invention, the disposition rate of the p type hole implantation layer may be 20% to 25%.

In the diode according to one preferred embodiment of the present invention, the n type semiconductor layer may have a thickness of 115 μm or more.

In the diode according to one preferred embodiment of the present invention, the p type hole implantation layer may have an impurity concentration of $1\times10^{18}$ cm$^{-3}$ to $1\times10^{19}$ cm$^{-3}$.

In the diode according to one preferred embodiment of the present invention, an n type buffer layer may be further included that is disposed between the n type cathode layer and the n type drift layer and that has an impurity concentration lower than the n type cathode layer and higher than the n type drift layer.

In the diode according to one preferred embodiment of the present invention, the n type drift layer may have an impurity concentration of $5\times10^{12}$ cm$^{-3}$ to $5\times10^{14}$ cm$^{-3}$, and the n type cathode layer may have an impurity concentration of $1\times10^{18}$ cm$^{-3}$ to $5\times10^{20}$ cm$^{-3}$, and the n type buffer layer may have an impurity concentration of $5\times10^{15}$ cm$^{-3}$ to $1\times10^{17}$ cm$^{-3}$.

In the diode according to one preferred embodiment of the present invention, the n type drift layer may include an active region in which the p type anode layer is chiefly disposed and an outer peripheral region that surrounds the active region, and the p type hole implantation layer may be disposed at least so as to face the active region.

In the diode according to one preferred embodiment of the present invention, a p type FLR structure may be included that is disposed at the surface part of the n type drift layer in the outer peripheral region, and the p type hole implantation layer maybe disposed so as not to face the p type FLR structure.

The diode according to one preferred embodiment of the present invention may include a crystal defect that is formed in substantially a whole of the n type drift layer.

In the diode according to one preferred embodiment of the present invention, the p type hole implantation layer may have a dot shape.

In the diode according to one preferred embodiment of the present invention, a plurality of p type hole implantation layers each of which has the dot shape may be disposed so as to be separated from each other.

In the diode according to one preferred embodiment of the present invention, the p type hole implantation layer may have a stripe shape.

Preferred embodiments of the present invention will be hereinafter described in detail with reference to the accompanying drawings.

FIG. 1 is a schematic plan view of a pn diode 1 according to a preferred embodiment of the present invention.

Figure 2:
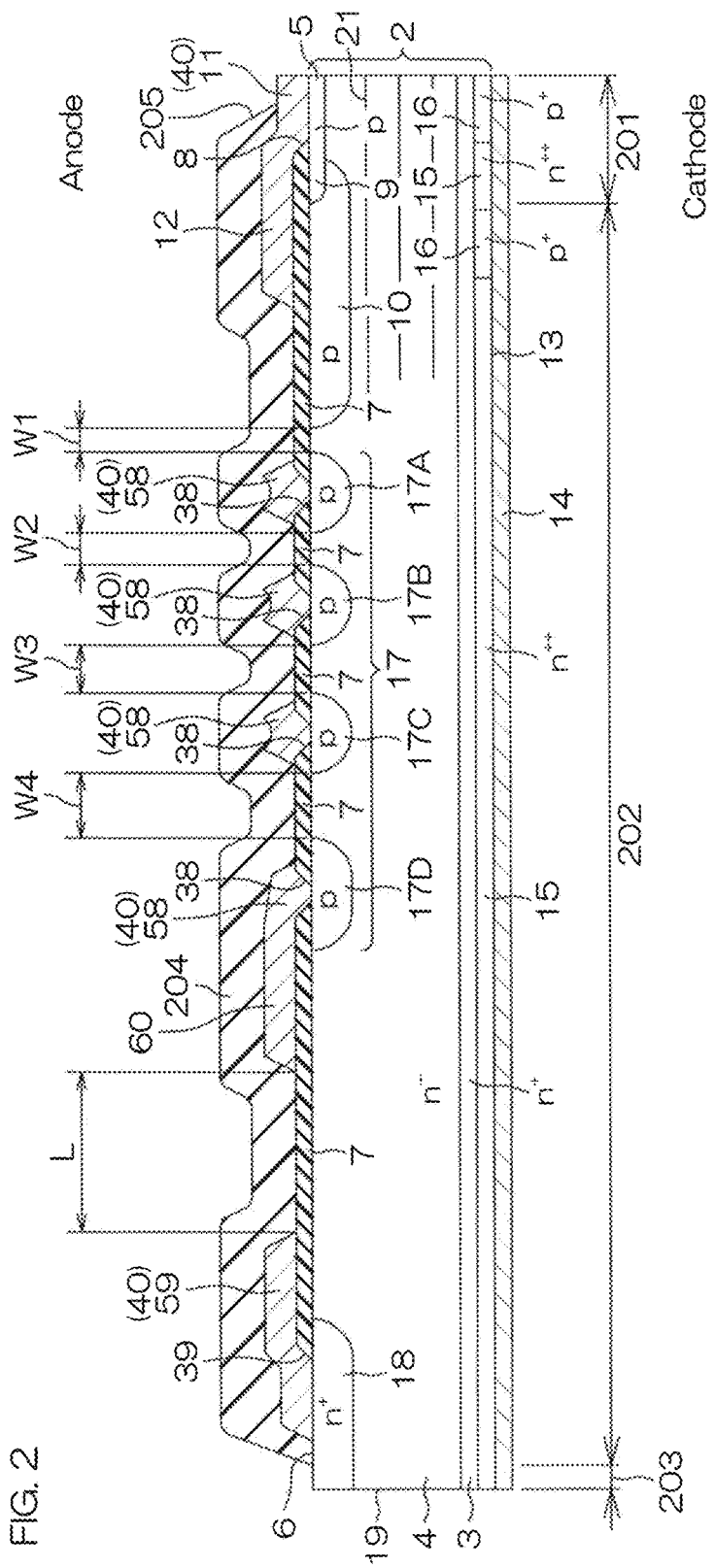
FIG. 2 is a cross-sectional view along section line II-II in FIG. 1.

FIG. 2 is a cross-sectional view along section line II-II in FIG. 1.

The pn diode 1 is a diode suitably usable as a fast recovery diode, and is a chip-shaped diode, for example, having a square shape in a plan view or a rectangular shape in a plan view. Its chip size may be, for example, 1.0 mm×1.0 mm to 20 mm×20 mm.

The pn diode 1 includes an active region 201, an outer peripheral region 202 that surrounds the active region 201, and a scribe region 203 that surrounds the outer peripheral region 202.

A surface protection film 204 (hatched part of FIG. 1) is formed so as to cover the active region 201 and the outer peripheral region 202, and, in contrast, so as to expose the scribe region 203. The surface protection film 204 has an opening 205 formed so as to expose a part of an anode electrode 11 (described later) as a pad.

The pn diode 1 includes an n type semiconductor layer 2. The n type semiconductor layer 2 includes an n$^{++}$ type cathode region 15, an n$^-$ type drift region 4 on the n$^{++}$ type cathode region 15, and an n$^+$ type buffer region 3 between the n$^{++}$ type cathode region 15 and the n$^-$ type drift region 4.

The n type semiconductor layer 2 may be produced, for example, by implanting an n type impurity into an n− type FZ wafer produced according to a floating zone (FZ) method so as to form the n$^+$ type buffer region 3 and the n$^{++}$ type cathode region 15 while selectively changing its concentration. Alternatively, it may be arranged so as to allow the n$^-$ type drift region 4 to epitaxially grow on the n$^+$ type buffer region 3 serving as a base substrate and so as to form the n$^{++}$ type cathode region 15 by means of ion implantation into the reverse surface of the base substrate.

In the active region 201, a p type anode region 5 is formed at the n type semiconductor layer 2. The p type anode region 5 maybe an impurity diffusion layer selectively formed at the surface part of the n$^-$ type drift region 4. As a result, in the n type semiconductor layer 2, a pn junction is formed between the p type anode region 5 and the n$^-$ type drift region 4.

In the outer peripheral region 202, a p type well 10 and a p type FLR (Field Limiting Ring) 17 are formed at the surface part of the n$^-$ type drift region 4. The p type well 10 is formed in an annular shape having a larger outer diameter than the diameter of the p type anode region 5, and is disposed so as to entirely cover a peripheral edge 9 of the p type anode region 5 from below. An outer peripheral edge of the p type well 10 is disposed outside the outer peripheral edge of the p type anode region 5.

A plurality of p type FLRs 17 are formed so as to surround the p type well 10. In the present preferred embodiment, the p type FLR 17 includes four p type FLRs 17A to 17D in order from a side closest to the p type well 10 toward a side farthest therefrom. Intervals W1 to W4 between mutually adjoining p type FLRs 17 (in the innermost p type FLR 17, the interval is between the innermost p type FLR 17 and the p type well 10) become larger in order from the side closest to the p type well 10 toward the side farthest therefrom. For example, the interval W1 may be about 15 μm (W1=15 μm), the interval W2 may be about 17 μm (W2=17 μm), the interval W3 may be about 19 μm (W3=19 μm), and the interval W4 may be about 23 μm (W4=23 μm).

In the outer peripheral region 202, an $n^+$ type channel stop region 18 is additionally formed at the surface part of the $n^-$ type drift region 4. The $n^+$ type channel stop region 18 may be formed so as to reach an end surface 19 of the n type semiconductor layer 2 from the outer peripheral region 202.

A field insulating film 7 is formed on a surface 6 of the n type semiconductor layer 2. The field insulating film 7 has a contact hole 8 through which the p type anode region 5 is selectively exposed. The p type anode region 5 is formed at the entire inner region of the contact hole 8, and extends toward the outside of the contact hole 8 in a straddling manner. As a result, the peripheral edge 9 of the p type anode region 5 is covered with the field insulating film 7. The contact hole 8 may have, for example, a tapered side surface in which its diameter becomes smaller from its opening end toward the surface 6 of the n type semiconductor layer 2.

The field insulating film 7 has a contact hole 38 through which the p type FLR 17 is selectively exposed and an outer periphery removing region 39 through which the $n^+$ type channel stop region 18 is selectively exposed.

An electrode film 40 is selectively formed on the surface 6 of the n type semiconductor layer 2. The electrode film 40 includes the anode electrode 11, a field plate 58, and an EQR (EQui-potential Ring) electrode 59.

The anode electrode 11 is connected to the p type anode region 5 inside the contact hole 8 of the field insulating film 7. Additionally, the anode electrode 11 has an overlap portion 12 that rides on the field insulating film 7 from the contact hole 8 and that faces both the peripheral edge 9 of the p type anode region 5 and the p type well 10 with the field insulating film 7 placed therebetween. The position of the outer peripheral edge of the overlap portion 12 may be set between the outer peripheral edge of the p type anode region 5 and the outer peripheral edge of the p type well 10.

The field plate 58 is formed in each of the p type FLRs 17A to 17D. Each field plate 58 is connected to each p type FLR 17A to 17D inside the contact hole 38 of the field insulating film 7. The field plate 58 connected to the p type FLR 17D at the outermost side has a drawn portion 60 drawn toward the end surface 19 on the field insulating film 7. The length of the drawn portion 60 may be, for example, about 50 μm.

The EQR electrode 59 is connected to the $n^+$ type channel stop region 18 in the outer periphery removing region 39 of the field insulating film 7. The distance L (insulation distance) between the inner peripheral edge of the EQR electrode 59 and the outer peripheral edge of the outermost field plate 58 may be, for example, 30 μm to 60 μm.

The surface protection film 204 is formed so as to cover the electrode film 40.

The reverse surface part of the n type semiconductor layer 2, i.e., the $n^{++}$ type cathode region 15 has its part at which a $p^+$ type hole implantation region 16 is selectively formed. The $p^+$ type hole implantation region 16 passes through the $n^{++}$ type cathode region 15, and, at its upper end, is brought into contact with the $n^+$ type buffer region 3. In the present preferred embodiment, the $p^+$ type hole implantation region 16 is selectively disposed only at the active region 201 and its environs (e.g., a region not facing the p type FLR 17).

According to a simulation performed by the present inventor, in the outer peripheral region 202, an electron concentration during a switching operation of the pn diode 1 is lower in a region comparatively distant from the active region 201 than in the active region 201 and its environs, because the effect of hole implantation of the $p^+$ type hole implantation region 16 (described later) is small even if the $p^+$ type hole implantation region 16 is disposed. For example, with respect to the electron concentration during a switching operation, the electron concentration is about $10^{10}$ to $10^{13}$ cm$^{-3}$ in a region facing the p type FLR 17 in the outer peripheral region 202, whereas the electron concentration is about $10^{13}$ to $10^{16}$ cm$^{-3}$ in the active region 201 and its environs, which is comparatively high.

A cathode electrode 14 is formed on a reverse surface 13 of the n type semiconductor layer 2. The cathode electrode 14 is connected to the $n^{++}$ type cathode region 15 and to the $p^+$ type hole implantation region 16 in the reverse surface 13 of the n type semiconductor layer 2.

In the pn diode 1, crystal defects 21 are formed from the upper surface of the p type anode region 5 toward the reverse surface of the $n^-$ type drift region 4 in the n type semiconductor layer 2. The crystal defects 21 are formed in substantially the whole of the $n^-$ type drift region 4. Although the crystal defect 21 is an atom-level or molecule-level structural defect given by, for example, electron irradiation, and is difficult to illustrate structurally in detail, horizontal lines are schematically given in the $n^-$ type drift region 4 at equal intervals from the upper side of the $n^-$ type drift region 4 toward the lower side thereof in FIG. 2. For clarification, only the crystal defects 21 in the active region 201 and its environs are shown in FIG. 2.

The details of each element of the pn diode 1 will be hereinafter described.

The n type semiconductor layer 2 is made up of, for example, semiconductor materials including Si, and, more specifically, may be made up of Si or SiC.

The $n^+$ type buffer region 3, the $n^-$ type drift region 4, the $n^+$ type channel stop region 18, and the $n^{++}$ type cathode region 15 are semiconductor regions that contain n type impurities. For example, N (nitrogen), P (phosphorus), As (arsenic), etc., are usable as the n type impurities contained therein (the same applies hereinafter when reference is made to n type impurities). The impurity concentration of the $n^+$ type buffer region 3 may be, for example, $5 \times 10^{15}$ cm$^{-3}$ to $1 \times 10^{17}$ cm$^{-3}$. The impurity concentration of the $n^-$ type drift region 4 may be, for example, $5 \times 10^{12}$ cm$^{-3}$ to $5 \times 10^{14}$ cm$^{-3}$. The impurity concentration of the $n^+$ type channel stop region 18 may be, for example, $1 \times 10^{17}$ cm$^{-3}$ to $1 \times 10^{22}$ cm$^{-3}$. The impurity concentration of the $n^{++}$ type cathode region 15 may be, for example, $1 \times 10^{18}$ cm$^{-3}$ to $5 \times 10^{20}$ cm$^{-3}$. The thickness of the $n^+$ type buffer region 3 may be, for example, 0.3 μm to 600 μm, and the thickness of the $n^-$ type drift region 4 may be, for example, 30 μm to 300 μm. The depth from the surface 6 of the $n^+$ type channel stop region 18 may be, for example, 2 μm to 3 μm.

The p type anode region 5, the p type well 10, the p type FLR 17, and the $p^+$ type hole implantation region 16 are semiconductor regions that contain p type impurities. For example, B (boron), Al (aluminum), Ar (argon), etc., are usable as the p type impurities contained therein (the same applies hereinafter when reference is made to p type impurities). Although the impurity concentration of each of the p type anode region 5, the p type well 10, and the p type FLR 17 is, for example, $1\times10^{15}$ cm$^{-3}$ to $1\times10^{20}$ cm$^{-3}$, the impurity concentration of the p type anode region 5 is lower than that of the p type well 10 and that of the p type FLR 17 within this range in the present preferred embodiment. The depth from the surface 6 of the p type anode region 5 is smaller than that of the p type well 10 and that of the p type FLR 17, and is, for example, 1 μm to 3 μm. On the other hand, the depth from the surface 6 of the p type well 10 and that of the p type FLR 17 are equal to each other, and the depth may be, for example, 6 μm to 10 μm. The impurity concentration of the p$^+$ type hole implantation region 16 may be, for example, $1\times10^{18}$ cm$^{-3}$ to $1\times10^{19}$ cm$^{-3}$.

The field insulating film 7 can be made of, for example, SiO$_2$ (silicon oxide), and can be formed by, for example, thermal oxidation or CVD (chemical vapor deposition). The thickness of the field insulating film 7 may be, for example, 0.5 μm to 5.0 μm.

The surface protection film 204 can be made of, for example, polyimide, and can be formed according to, for example, a spin coating method.

The pn diode 1 mentioned above can be manufactured according to the following method.

For example, first, an n$^-$ type FZ wafer is prepared. The n$^-$ type FZ wafer is a constituent element of the n type semiconductor layer 2, and the most of it provides the n$^-$ type drift region 4.

Thereafter, a device structure (the p type anode region 5, the p type well 10, the field insulating film 7, the anode electrode, etc.) is formed at a surface part of the n$^-$ type FZ wafer.

Thereafter, a support substrate is joined to the device structure formed at the surface part of the n$^-$ type FZ wafer through, for example, a bonding tape or the like. The bonding tape may consist of a blowing agent portion made of a foamed-tape type sheet that is peelable resulting from foam by heating and a UV tape layer made of a heat-resistant UV-tape type sheet that is peelable resulting from the hardening of an adhesive by irradiating a beam of UV light that are disposed on both sides of a tape base material made of PET, respectively. A UV tape layer of the bonding tape is affixed onto the support substrate.

Thereafter, the n$^-$ type FZ wafer is ground from the reverse surface side by back grinding, wet etching, or the like in a state of being supported by the support substrate, and the entire thickness of the n$^-$ type FZ wafer including the surface-side device structure portion is adjusted to be a desired size.

Thereafter, the aforementioned n type impurity is implanted into the entire reverse surface of the n$^-$ type FZ wafer at a first concentration, and is then implanted thereinto at a second concentration that is higher than the first concentration. Thereafter, in a state in which the reverse surface of the n$^-$ type FZ wafer is selectively covered with a mask, the aforementioned p type impurity is implanted into the reverse surface of the n$^-$ type FZ wafer. Thereafter, the n$^+$ type buffer region 3, the n$^{++}$ type cathode region 15, and the p$^+$ type hole implantation region 16 are formed at a reverse surface part of the n$^-$ type FZ wafer by performing annealing while radiating, for example, a laser beam onto the reverse surface of the n$^-$ type FZ wafer.

Thereafter, crystal defects 21 are formed in the n$^-$ type drift region 4 by radiating an electron beam onto the reverse surface of the n$^-$ type FZ wafer.

Thereafter, the cathode electrode 14 is formed on the reverse surface of the n$^-$ type FZ wafer, and the pn diode 1 is obtained by allowing the support substrate to be peeled off.

Next, referring to FIG. 3A and FIG. 3B, a description will be given of the mechanism of hole implantation by the p+ type hole implantation region 16 in order to describe the effect of the present invention of being capable of effectively restraining voltage ringing during a recovery operation.

Figure 3A:
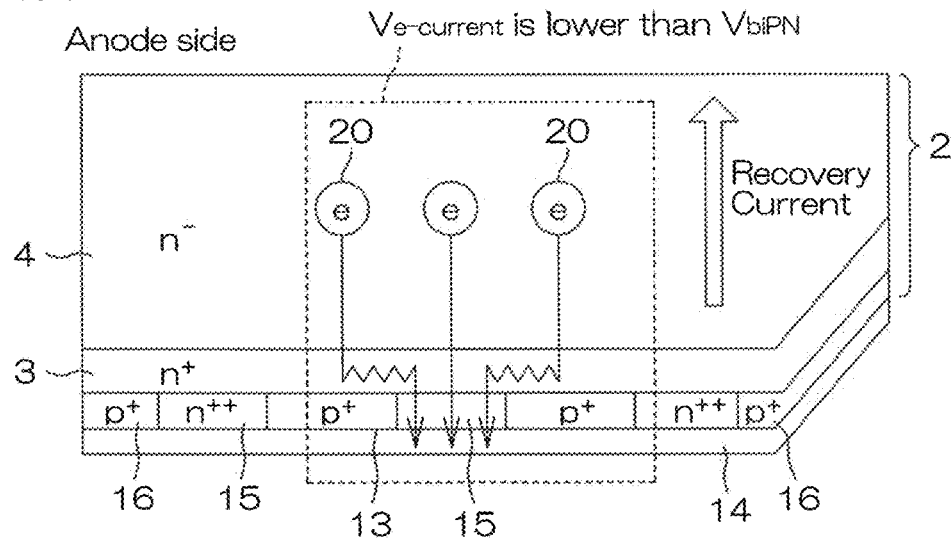
FIG. 3A and FIG. 3B are views to describe the mechanism of hole implantation by a $p^+$ type hole implantation region.
Figure 3B:
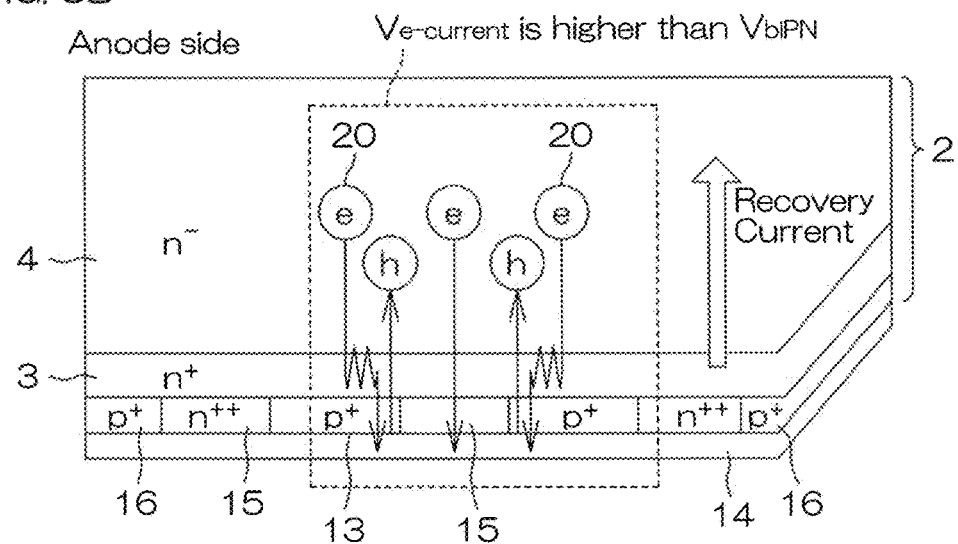

First, referring to FIG. 3A, an electron "e" implanted into the n$^-$ type drift region 4 from the cathode electrode 14 for example, during conduction in the forward direction, moves to the cathode electrode 14 along the thickness direction of the n$^-$ type drift region 4 when a switching operation is performed. At this time, in the n$^-$ type drift region 4, an electron e (to which reference sign 20 is given in FIG. 3A and FIG. 3B) at a position facing the p$^+$ type hole implantation region 16 moves to the neighborhood of the p$^+$ type hole implantation region 16, and then moves along the lateral direction (direction along the reverse surface 13 of the n type semiconductor layer 2) on the p$^+$ type hole implantation region 16, and proceeds to the n$^{++}$ type cathode region 15 through the n$^+$ type buffer region 3. Thereafter, as shown in FIG. 3B, when a voltage drop $V_{e\text{-}current}$ caused by the movement in the lateral direction of the electron e (20) becomes higher than a built-in voltage $V_{biPN}$ of the pn junction portion between the n$^+$ type buffer region 3 and the p$^+$ type hole implantation region 16 (i.e., $V_{e\text{-}current} > V_{biPN}$), the electron e (20) moving in the lateral direction moves to the p$^+$ type hole implantation region 16, and the implantation of holes starts from the p$^+$ type hole implantation region 16.

In this background, the present inventor verified what conditions are to be set in order to make it possible to start the aforementioned implantation of holes and thereby to effectively restrain voltage ringing.

(1) Comparison between widths (diameters) of the p$^+$ type hole implantation region 16

First, how the width (diameter) of the p$^+$ type hole implantation region 16 contributes to the aforementioned effect was examined by a simulation. The simulation was performed by setting the structure of FIG. 4 under the following conditions as shared conditions, i.e., forward current IF=20 A, reverse voltage VR=700 V, area of active region=1 cm$^2$, and disposition rate of p$^+$ type layer=50%. Here, the disposition rate of the p$^+$ type layer is calculated according to the expression (total area of the p$^+$ type layer)/(total area of a surface on which the p$^+$ type layer is formed)×100 (%). For example, in FIG. 1 and FIG. 2, it is calculated according to the expression (sum of areas of all p$^+$ type hole implantation regions 16)/area of the reverse surface 13 of the n type semiconductor layer 2)×100 (%).

Figure 4:
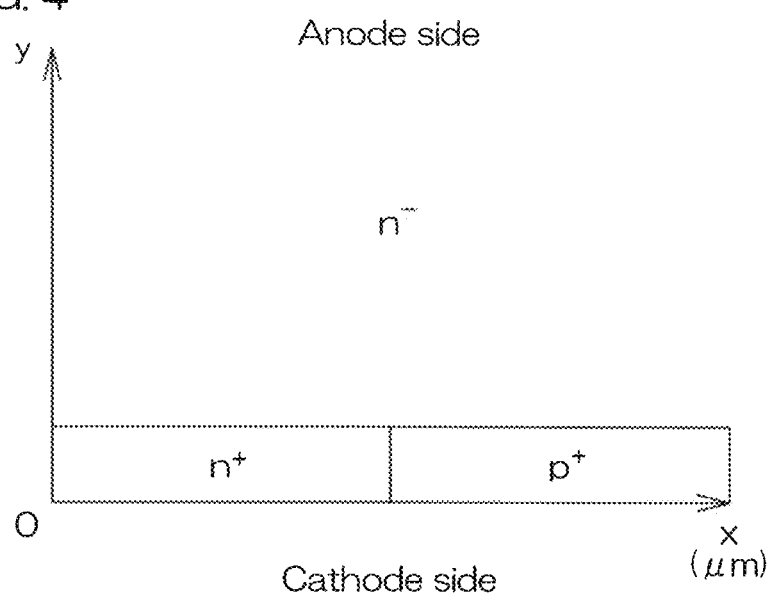
FIG. 4 is a schematic view showing a pn structure set by a simulation.

On the other hand, conditions varying according to a standard structure and according to each structure of verification examples are the width of the p$^+$ type layer of the x axis of FIG. 4 and the width of the n$^+$ type layer thereof. The standard structure has the condition of not having the p$^+$ type layer, and the structures of Verification Examples 1 to 4 have the conditions p:n=1.5 μm: 1.5 μm, p:n=15 μm: 15 μm, p:n 32 25 μm: 25 μm, and p:n=50 μm: 50 μm, respectively.

Figure 6A:
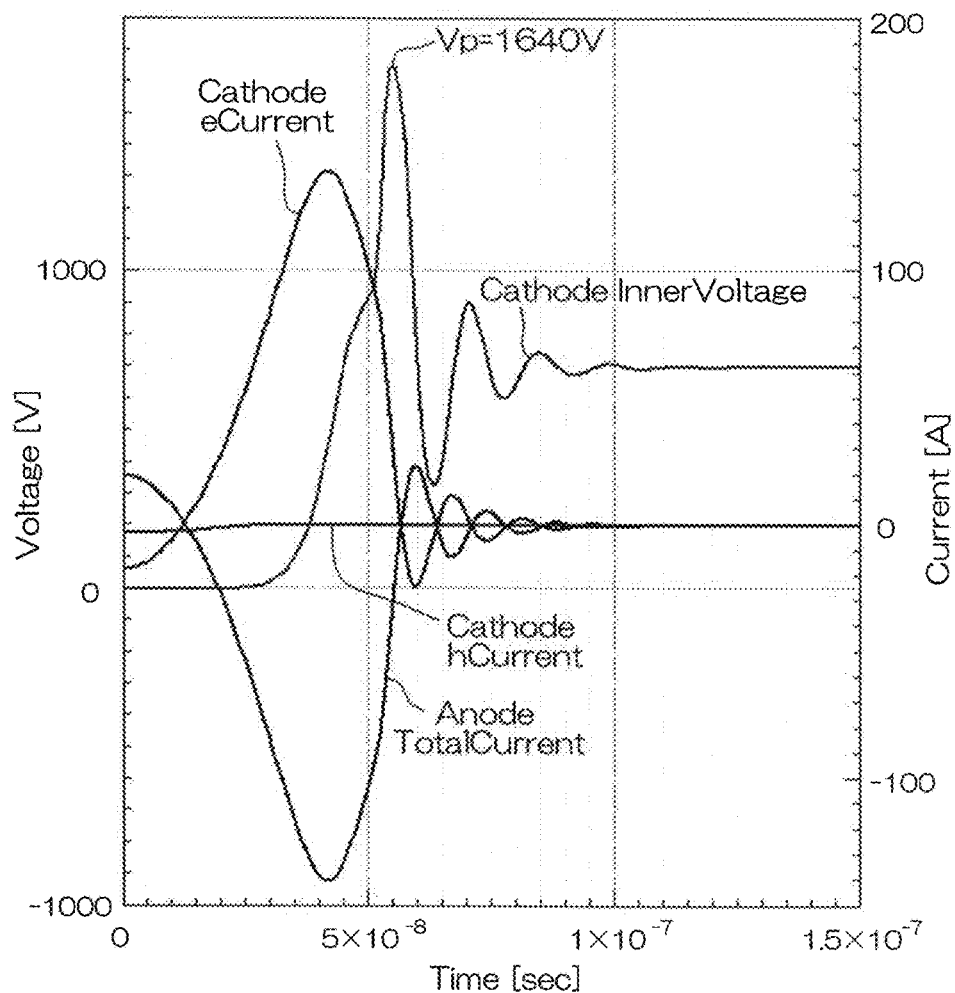
FIG. 6A is a view showing recovery characteristics of a structure of Verification Example 1.
Figure 6B:
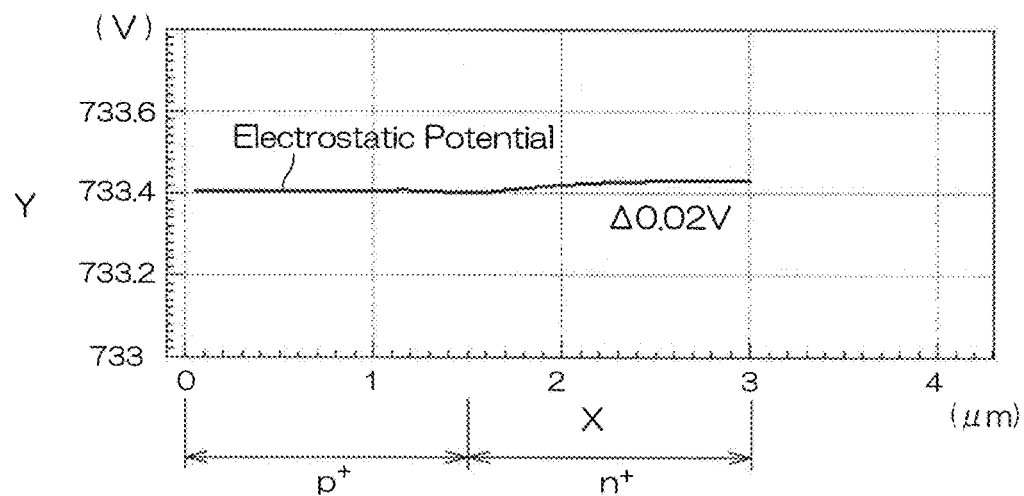
FIG. 6B is a view showing the magnitude of a voltage drop caused by an electron current of the structure of Verification Example 1.
Figure 7A:
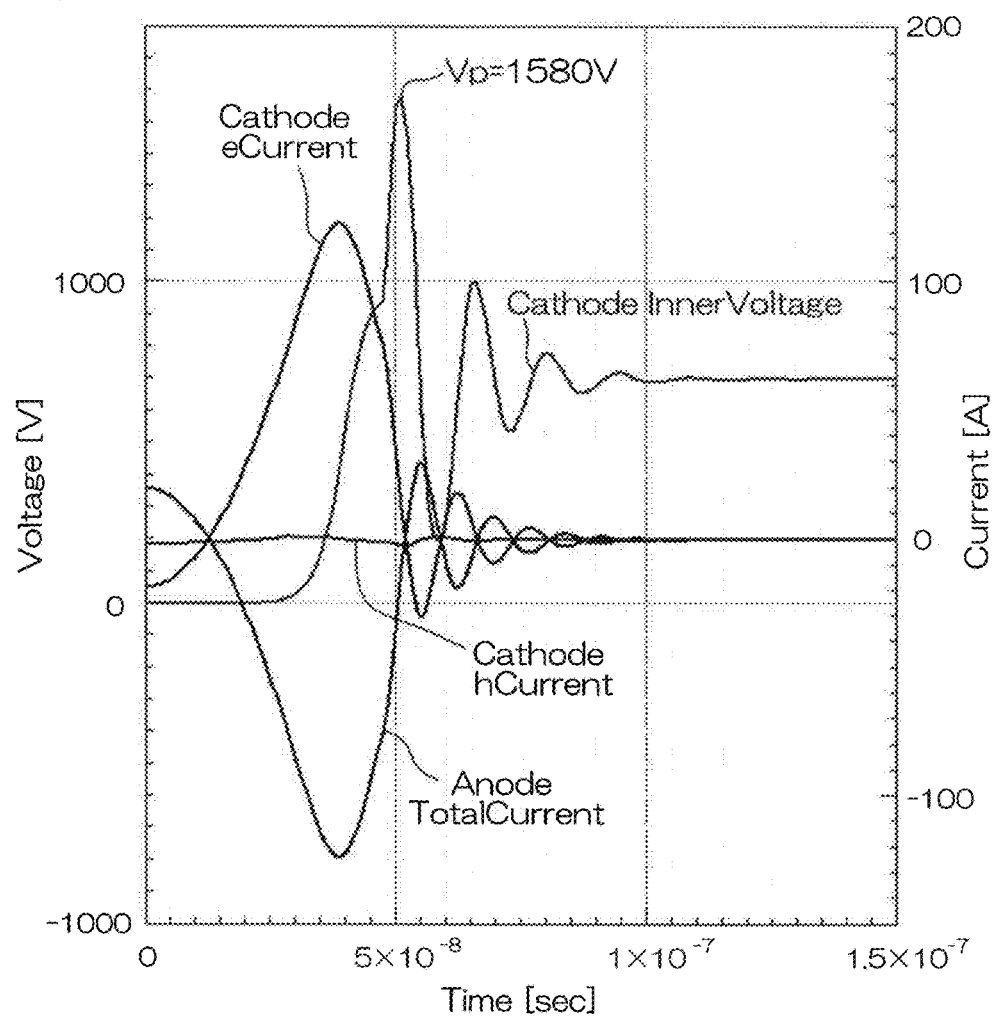
FIG. 7A is a view showing recovery characteristics of a structure of Verification Example 2.
Figure 7B:
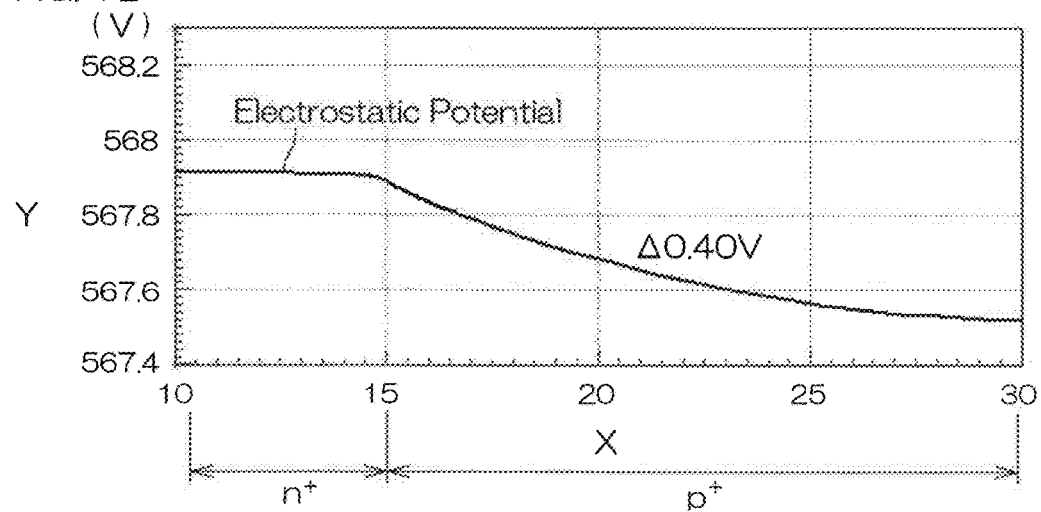
FIG. 7B is a view showing the magnitude of a voltage drop caused by an electron current of the structure of Verification Example 2.

Through the simulation under these conditions, recovery characteristics of the standard structure and of the structures of Verification Examples 1 to 4 were ascertained, and a voltage drop caused by an electron current moving on the p$^+$ type layer in the lateral direction was ascertained in Verification Examples 1 to 4. The results are shown in FIG. 5 to FIG. 8. It should be noted that each horizontal axis in FIG. 6B, FIG. 7B, FIG. 8B, and FIG. 9B corresponds to the x axis of FIG. 4 (however, only in FIG. 6B, the right and left of pn are opposite to those of FIG. 4). For example, in FIG. 7B showing Verification Example 1 (p:n=15 μm: 15 μm), the region of x=10 μm to 15 μm (that of 0 to 10 μm is omitted) shows an electric potential at each position of the n$^+$ type layer having a width of 15 μm, and the region of 15 μm to 30 μm shows an electric potential at each position of the p$^+$ type layer.

Figure 5:
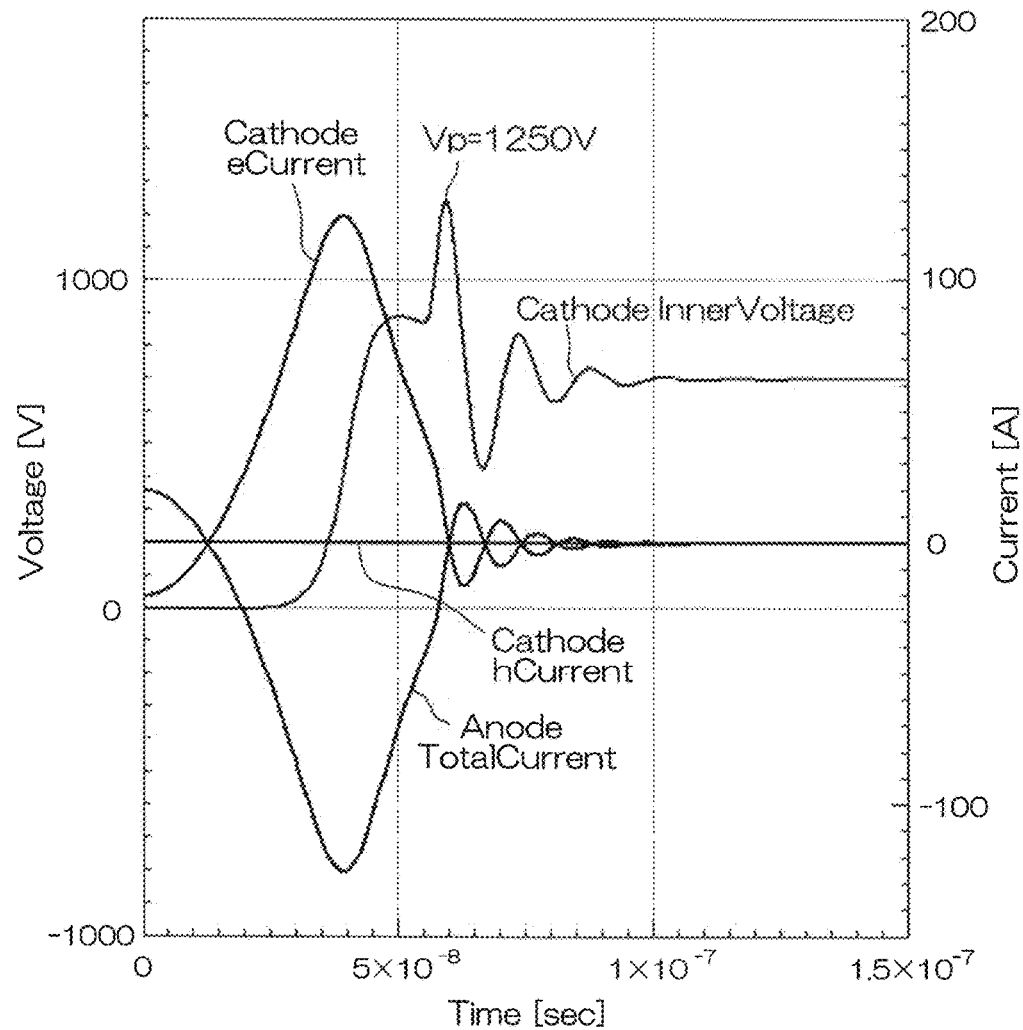
FIG. 5 is a view showing recovery characteristics of a standard structure.

First, according to FIG. 5, a reverse-surface p$^+$ type layer is not formed, and therefore large ringing (voltage surge) occurred during a switching operation, and its voltage peak Vp was 1250 V that is a high value. In Verification Example 1 of FIG. 6A, the width (diameter) is 1.5 μm that is a small value although the p$^+$ type layer is formed, and therefore ringing was not lessened, and the voltage peak Vp was Vp=1640 V that is higher than that of the standard structure. It is conceivable that this shows that a voltage drop $V_{e\text{-}current}$ has occurred above the p$^+$ type layer as shown in FIG. 6B, and yet is 0.02 V that is smaller than the built-in voltage $V_{biPN}$ (=about 0.72 V) of the pn junction portion, and therefore holes are not excellently implanted from the p$^+$ type layer. Concerning the fact that the voltage peak Vp becomes higher than that of the standard structure, it is conceivable that the reason is that the area of the n$^+$ type layer is decreased, so that the hole density on the cathode side is lowered. Likewise, in Verification Example 2 of FIG. 7A, the width (diameter) was 15 μm that is a small value, and therefore ringing was not lessened, and the voltage peak Vp was Vp=1580 V that is higher than that of the standard structure. However, as shown in FIG. 7B, the voltage drop $V_{e\text{-}current}$ above the p$^+$ type layer was 0.40 V that is higher than that of Verification Example 1.

Figure 8A:
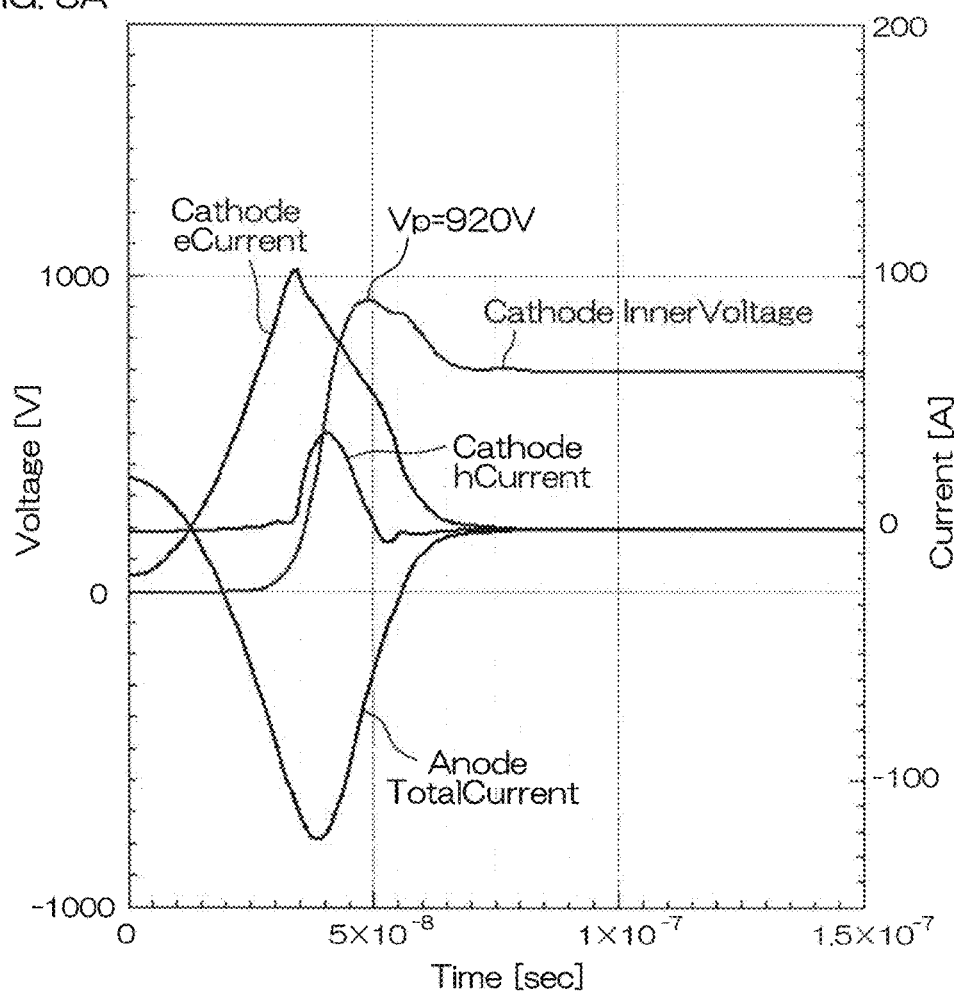
FIG. 8A is a view showing recovery characteristics of a structure of Verification Example 3.
Figure 8B:
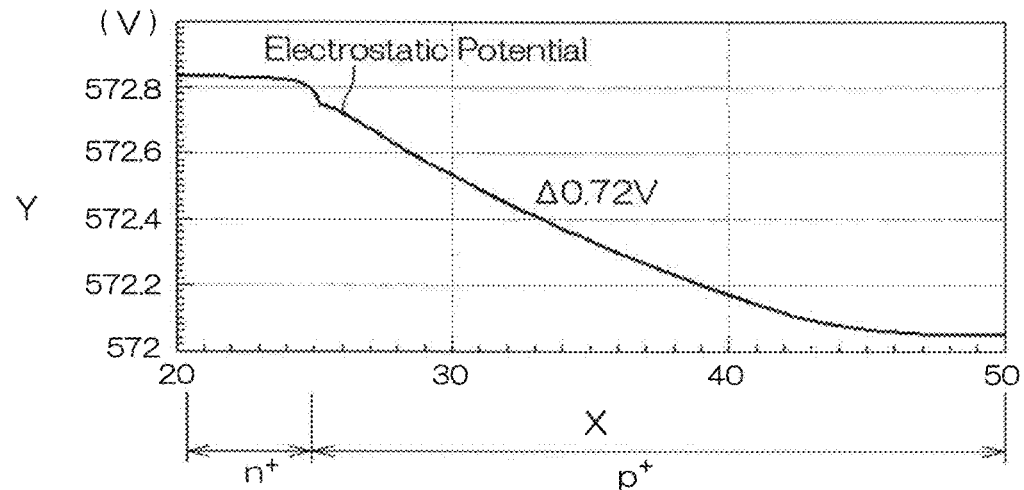
FIG. 8B is a view showing the magnitude of a voltage drop caused by an electron current of the structure of Verification Example 3.
Figure 9A:
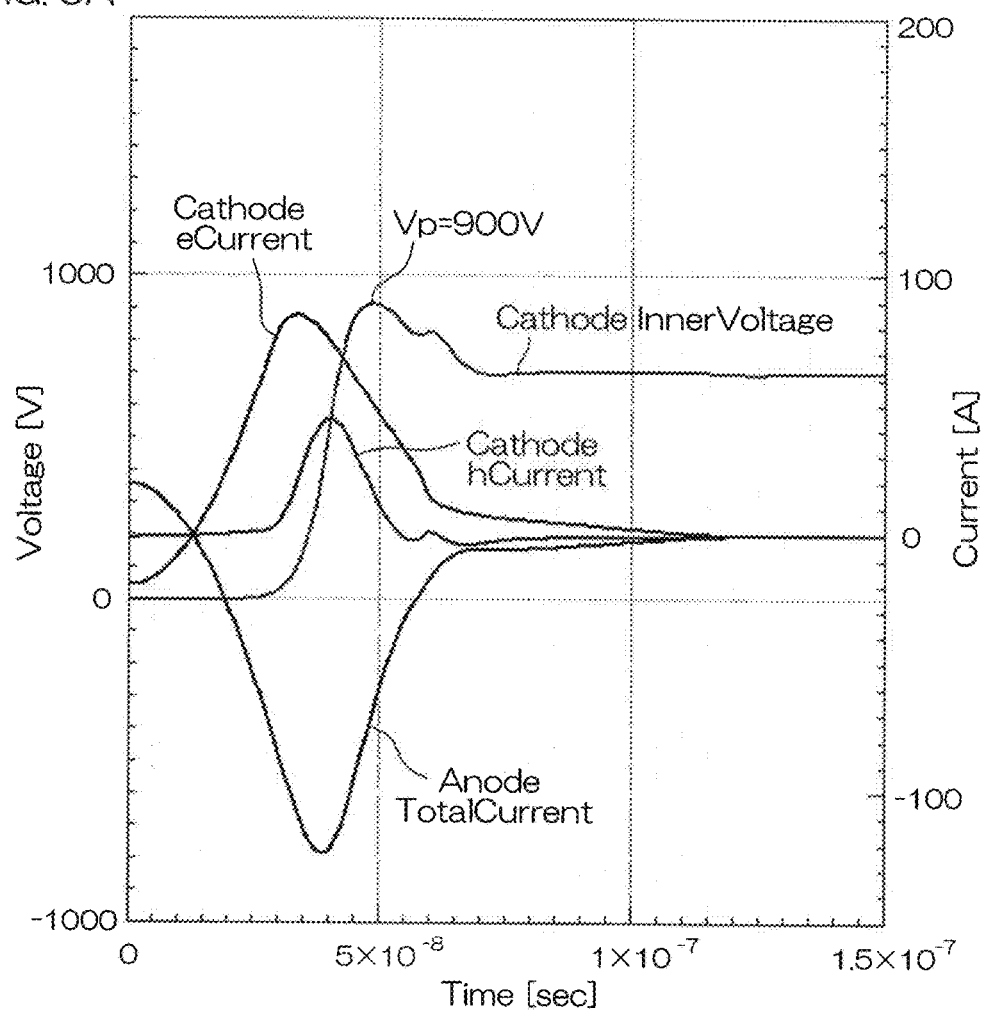
FIG. 9A is a view showing recovery characteristics of a structure of Verification Example 4.
Figure 9B:
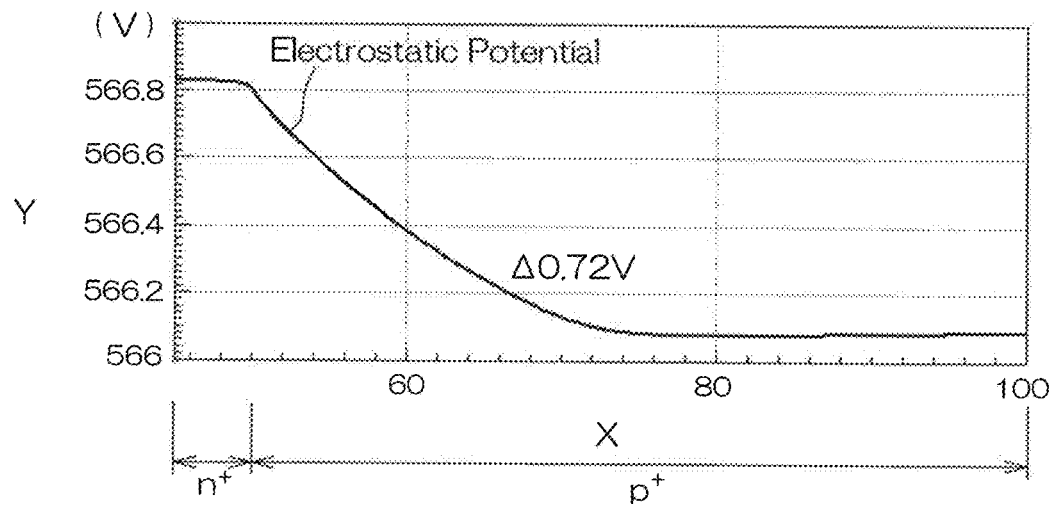
FIG. 9B is a view showing the magnitude of a voltage drop caused by an electron current of the structure of Verification Example 4.

On the other hand, in Verification Examples 3 and 4 shown in FIG. 8A and FIG. 9A, ringing during a switching operation was effectively lessened, and the voltage peak Vp was Vp=920 V and 900 V each of which is a low value less than 80% of that of the standard structure. This results from the fact that a sufficient distance in the lateral direction was secured above the reverse-surface p$^+$ type layer as shown in FIG. 8B and FIG. 9B, and, as a result, the expression $V_{e\text{-}current} > V_{biPN}$ was satisfied, and a hole current was sufficiently supplied.

Accordingly, it was verified that, if the diameter of the p$^+$ type hole implantation region 16 is 20 μm or more in the pn diode 1 of FIG. 1 and FIG. 2, a voltage drop caused by the movement along the p$^+$ type hole implantation region 16 of electrons can be sufficiently enlarged. As a result, it is possible to excellently implant holes from the p$^+$ type hole implantation region 16, and therefore it is possible to prevent carriers in the n$^-$ type drift region 4 from being depleted, and hence is possible to effectively restrain voltage ringing. If the p$^+$ type hole implantation region 16 is formed in a stripe shape, the diameter of the p$^+$ type hole implantation region 16 may be the width of each linear part forming a stripe. Additionally, if the p$^+$ type hole implantation region 16 is formed in a dot shape (see FIG. 17 and FIG. 18), it may be the diameter of each dot.

(2) Comparison between disposition rates of the p$^+$ type hole implantation region 16

Next, how the disposition rate (mentioned above) of the p$^+$ type hole implantation region 16 contributes to the restraint effect of the voltage ringing was examined by a simulation. The simulation was performed by setting the structure of FIG. 4 under the following conditions as shared conditions, i.e., forward current IF=20 A, reverse voltage VR=700 V, and area of active region=1 cm$^2$. The width of the p$^+$ type layer determined in "(1) Comparison between widths (diameters) of the p$^+$ type hole implantation region 16" mentioned above was not particularly set.

On the other hand, mutually different conditions are the disposition rates of the p$^+$ type layer. In this simulation, the disposition rate of the p$^+$ type layer was set by adjusting the width ratio between the p$^+$ type layer and the n$^+$ type layer in the structure of FIG. 4. The standard structure has the condition of not having the p$^+$ type layer (disposition rate=0%), and the other structures have the conditions p:n=50:150 (disposition rate=25%), p:n=50:100 (disposition rate=33%), and p:n=50:50 (disposition rate =50%), respectively.

Through the simulation under these conditions, recovery characteristics of the standard structure and of the other structures were ascertained, and the forward characteristic of the diode was also ascertained. The results are shown in FIG. 10 to FIG. 13.

Figure 10:
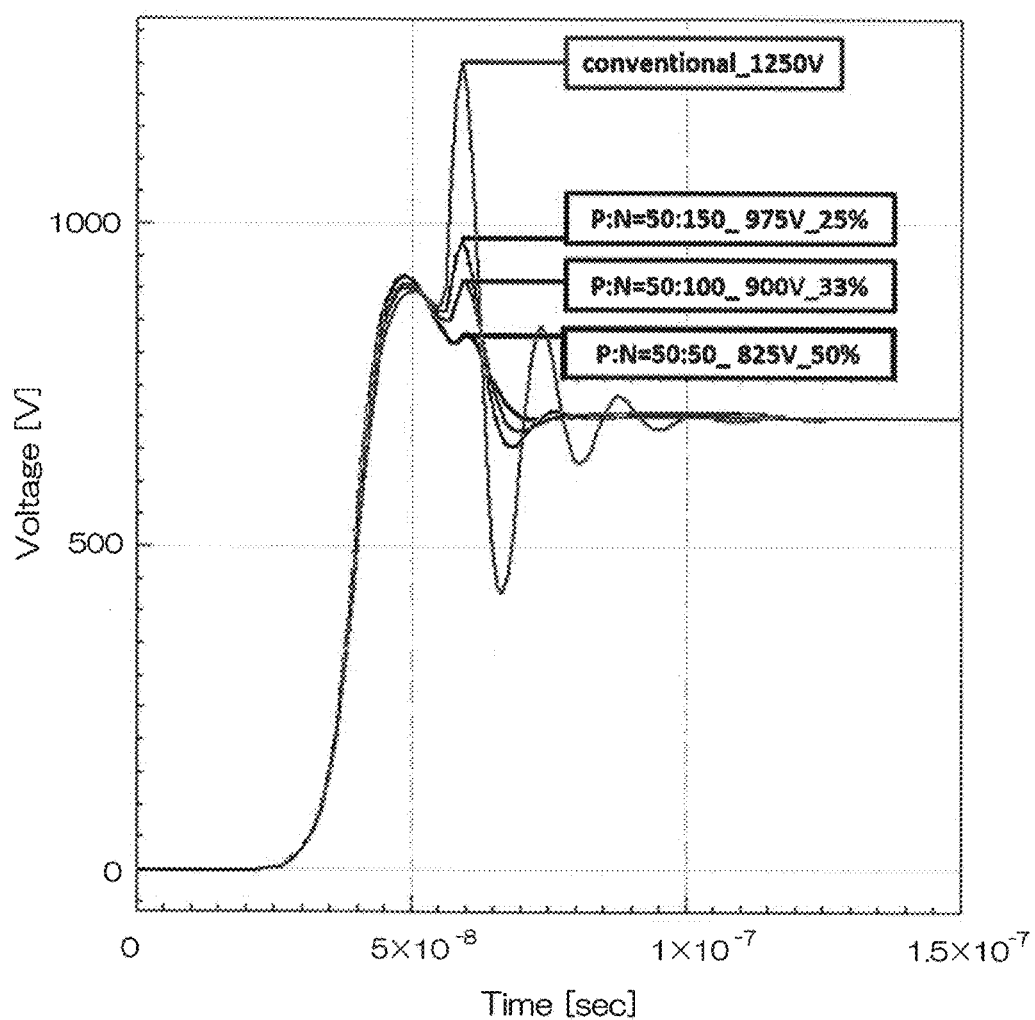
FIG. 10 is a view showing voltage waveforms during a switching operation when each disposition rate is employed.
Figure 11:
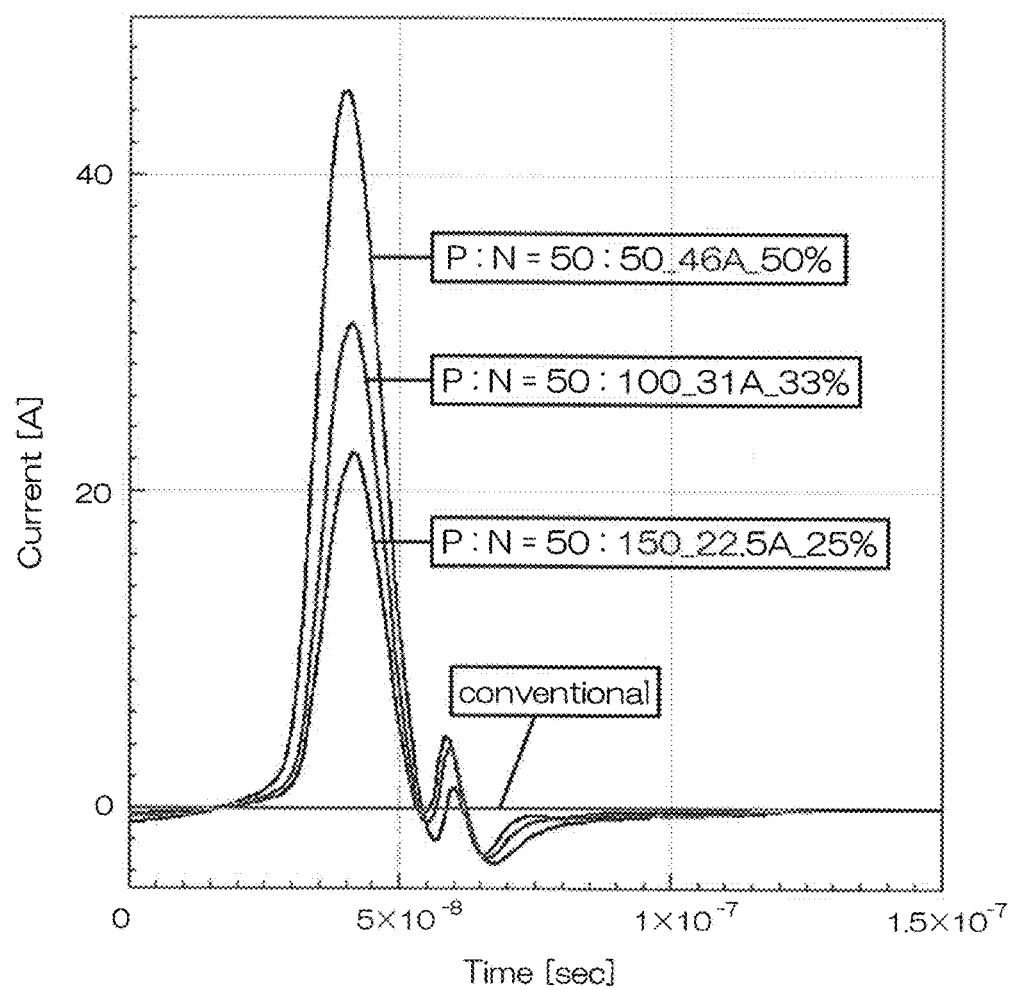
FIG. 11 is a view showing hole current waveforms during a switching operation when each disposition rate is employed.
Figure 12:
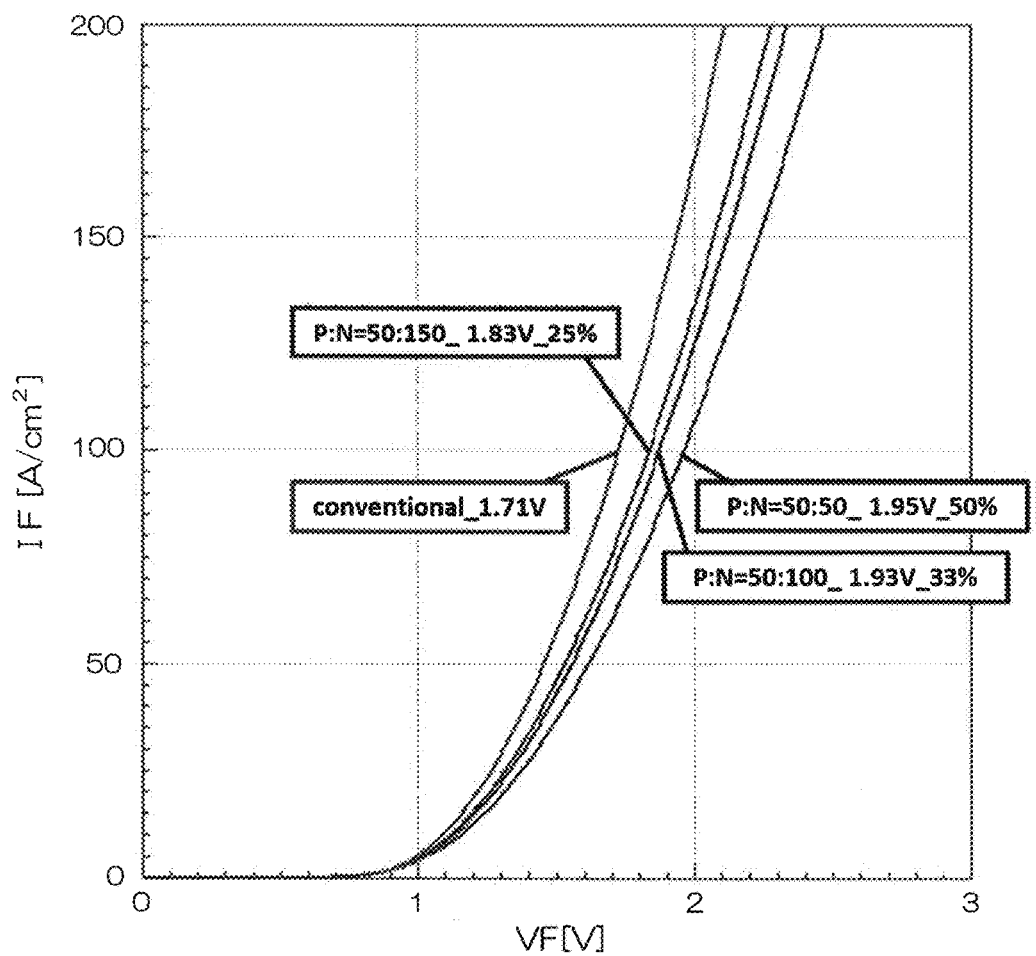
FIG. 12 is a view showing I-V characteristic curves when each disposition rate is employed.
Figure 13:
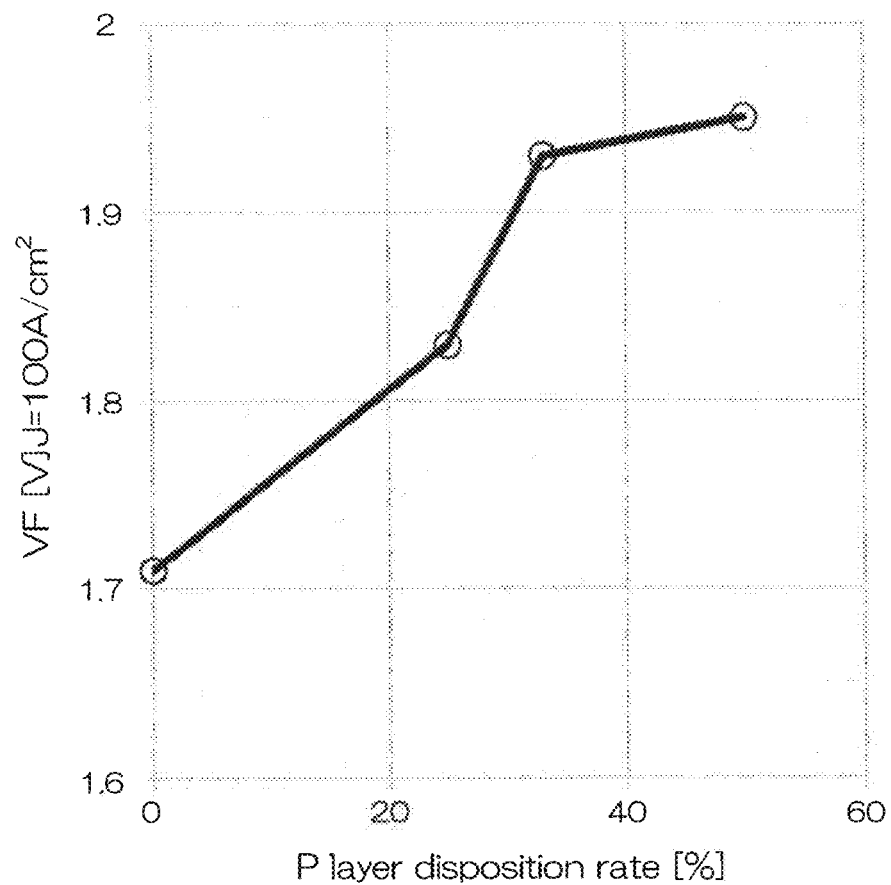
FIG. 13 is a view showing a relationship between the disposition rate and VF when each disposition rate is employed.

According to FIG. 10, the ringing during a switching operation was effectively made smaller in proportion to an increase in the disposition rate of the p$^+$ type layer, and any of the voltage peaks Vp was less than 1000 V that is a small value. It is conceivable that the reason is that holes are more excellently supplied from the p$^+$ type layer in proportion to an increase in the disposition rate of the p$^+$ type layer. Actually, when a comparison between the magnitudes of the hole current of FIG. 11 was made, the hole current flowing there became larger in proportion to an increase in the disposition rate of the p$^+$ type layer. On the other hand, if the disposition rate of the p$^+$ type layer is set to be high, the area of the n$^+$ type layer is reduced, and therefore the forward voltage VF of the diode tended to become higher as shown in FIG. 12 and FIG. 13.

Accordingly, in the pn diode 1 of FIG. 1 and FIG. 2, it is possible to more effectively restrain voltage ringing if the disposition rate of the p$^+$ type hole implantation region 16 is set to be 20% or more, of course, in addition to the condition, i.e., the diameter of the p$^+$ type hole implantation region 16, which was determined in "(1) Comparison between widths (diameters) of the p$^+$ type hole implantation region 16" mentioned above, ≥20 μm. Particularly, if the disposition rate of the p$^+$ type hole implantation region 16 is 20% to 25%, the forward characteristic of the pn diode 1 will be less influenced thereby.

(3) Comparison between thicknesses of the n type semiconductor layer 2

Next, how the thickness of the n type semiconductor layer 2 contributes to the restraint effect of the voltage ringing was examined by a simulation. The simulation was performed by setting the structure of FIG. 4 under the following conditions as shared conditions, i.e., forward current IF=20 A, reverse voltage VR=700 V, area of active region=1 cm$^2$, and disposition rate of p$^+$ type layer=50%. The width of the p$^+$ type layer determined in "(1) Comparison between widths (diameters) of the p$^+$ type hole implantation region 16" mentioned above was not particularly set.

On the other hand, mutually different conditions are thicknesses when the n type layer is made of Si (silicon). The Si thickness is shown by the y axis of FIG. 4.

Through the simulation under these conditions, recovery characteristics of the simulation structure were ascertained. The results are shown in FIG. 14 to FIG. 16.

Figure 14:
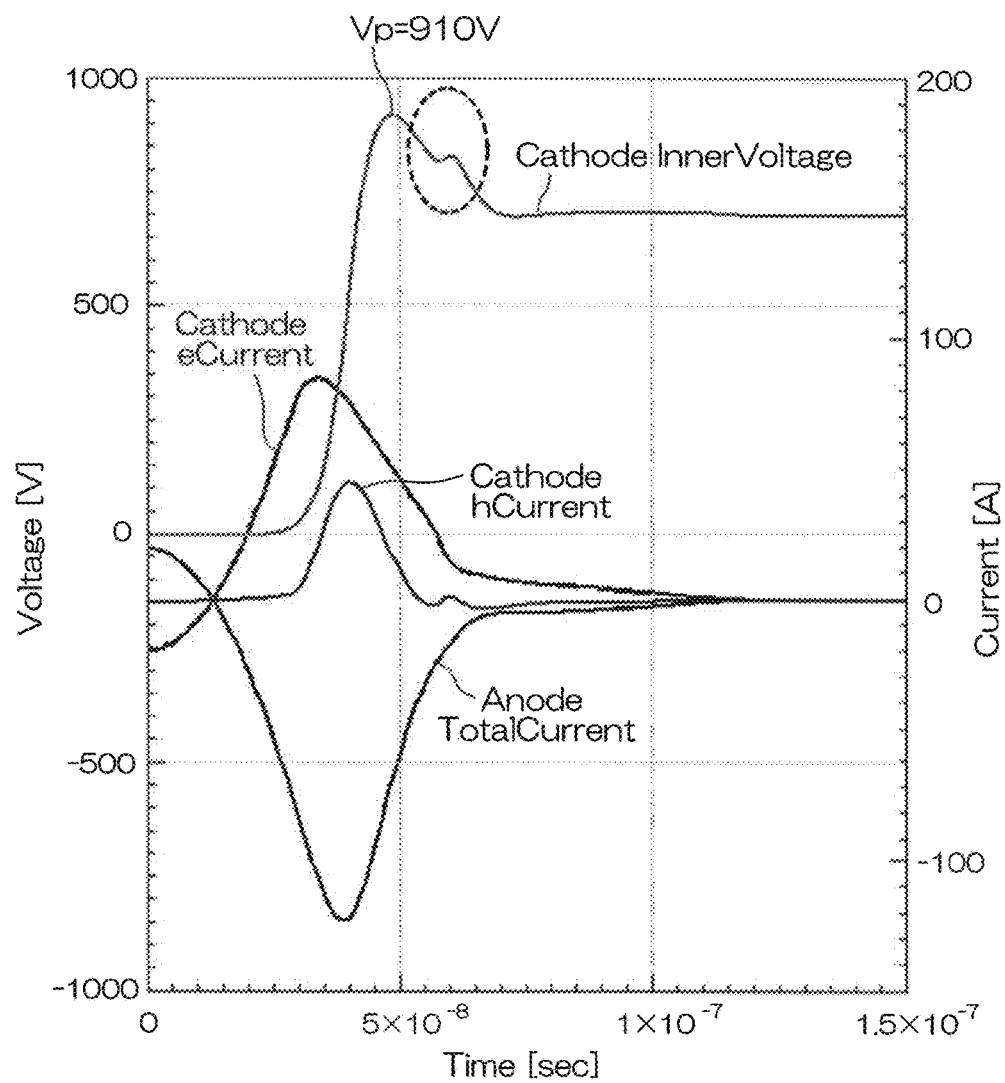
FIG. 14 is a view showing recovery characteristics when Si that has a thickness of 123 µm is employed.
Figure 15:
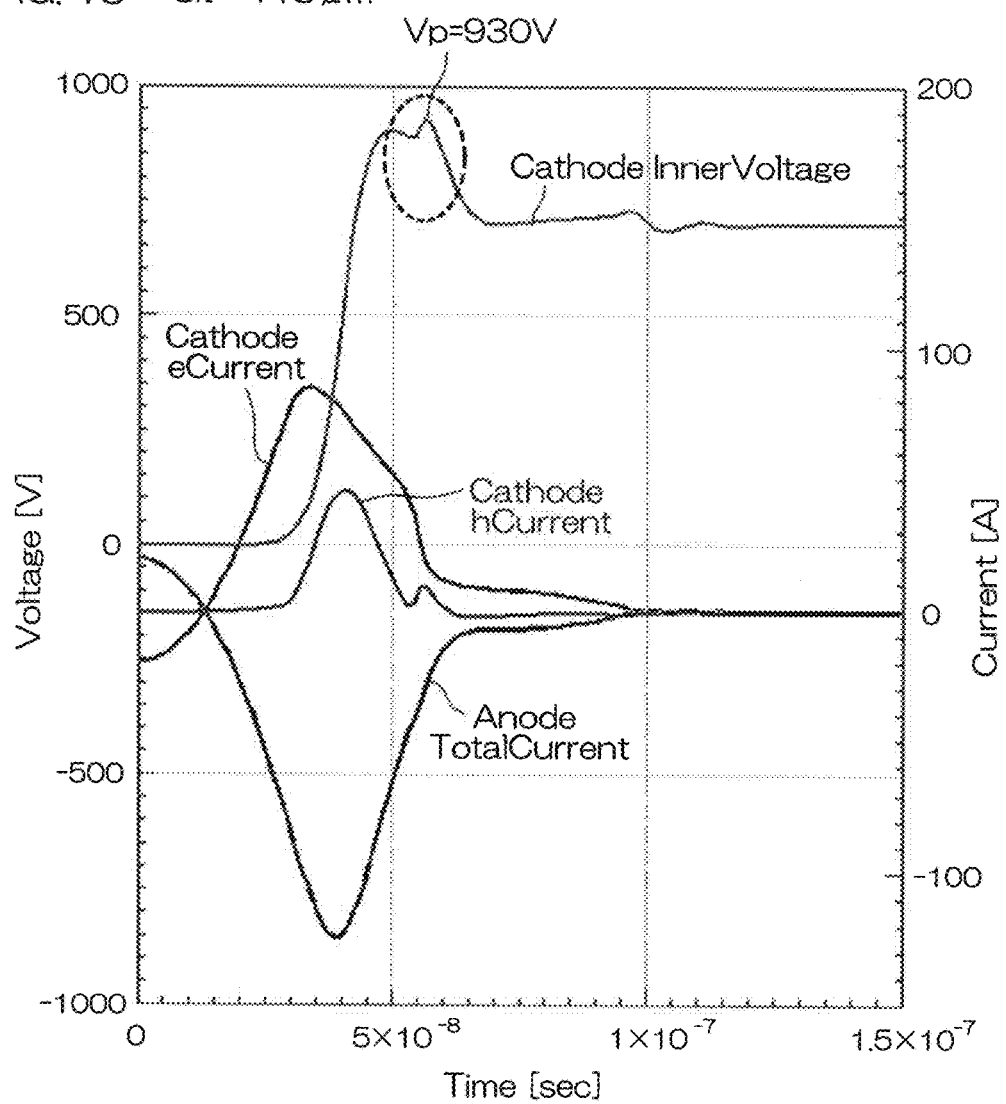
FIG. 15 is a view showing recovery characteristics when Si that has a thickness of 118 µm is employed.
Figure 16:
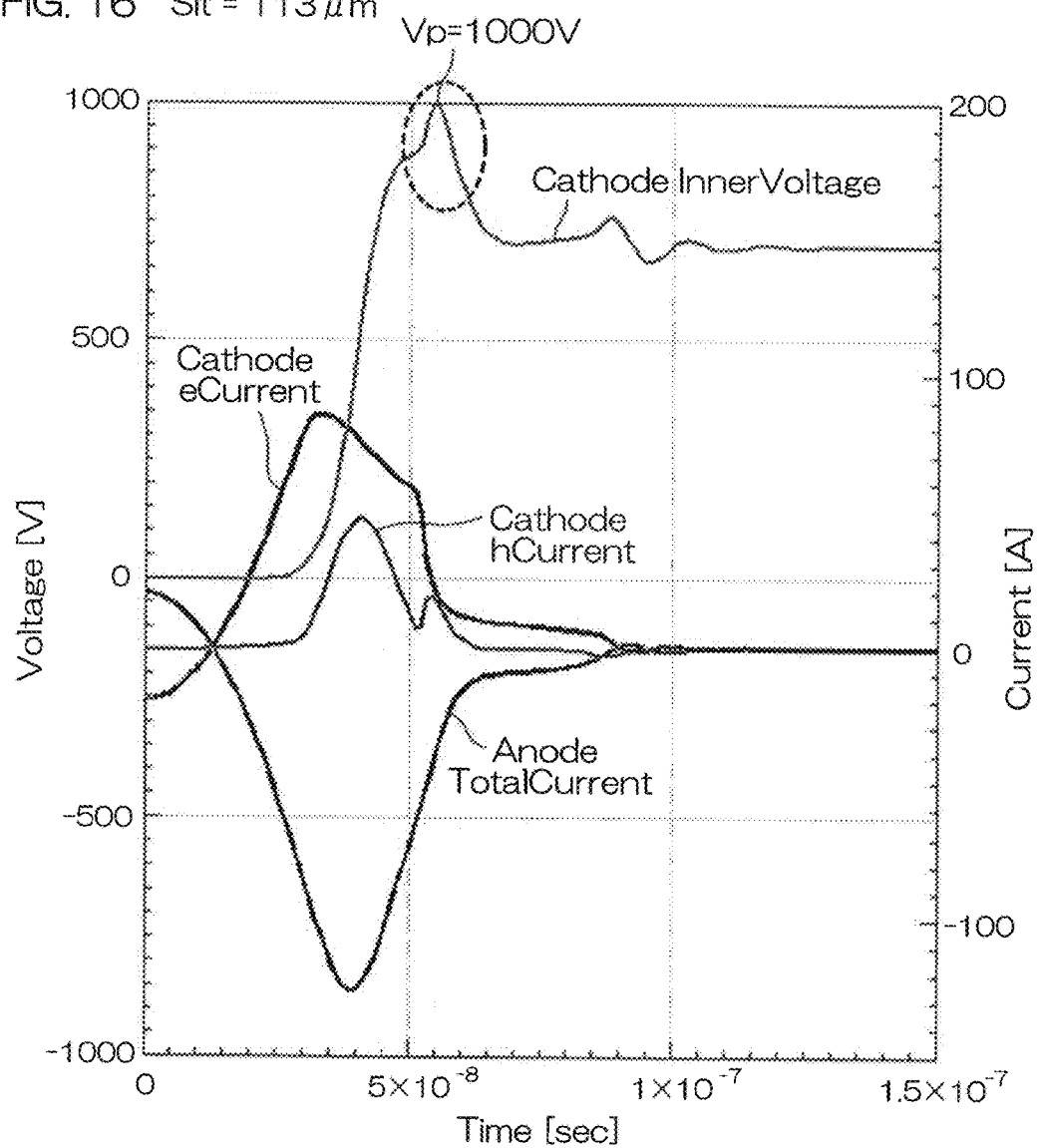
FIG. 16 is a view showing recovery characteristics when Si that has a thickness of 113 µm is employed.

Although the voltage peak Vp during a switching operation becomes larger in proportion to a decrease in the Si thickness according to FIG. 14 to FIG. 16, it did not become higher than that of the aforementioned standard structure (voltage peak Vp=1250 V) under the conditions of the simulation. Particularly, voltage peak Vp=1000 V when Si thickness=113 μm (see FIG. 16), and therefore, in a range exceeding this value, it is conceivable that the voltage peak Vp can be adjusted to be less than 1000 V. Therefore, if the Si thickness is, for example, 115 μm or more, it is possible to contribute to the restraint of the voltage peak during a switching operation.

(4) Patterns of the p⁺ type hole implantation region 16

Figure 17:
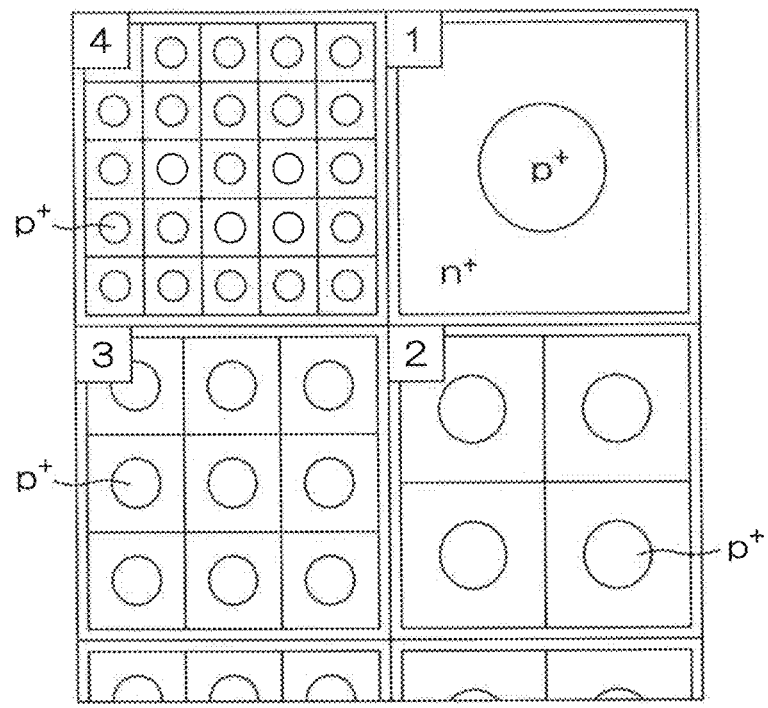
FIG. 17 is a view showing a disposition pattern of a $p^+$ type hole implantation region.
Figure 18:
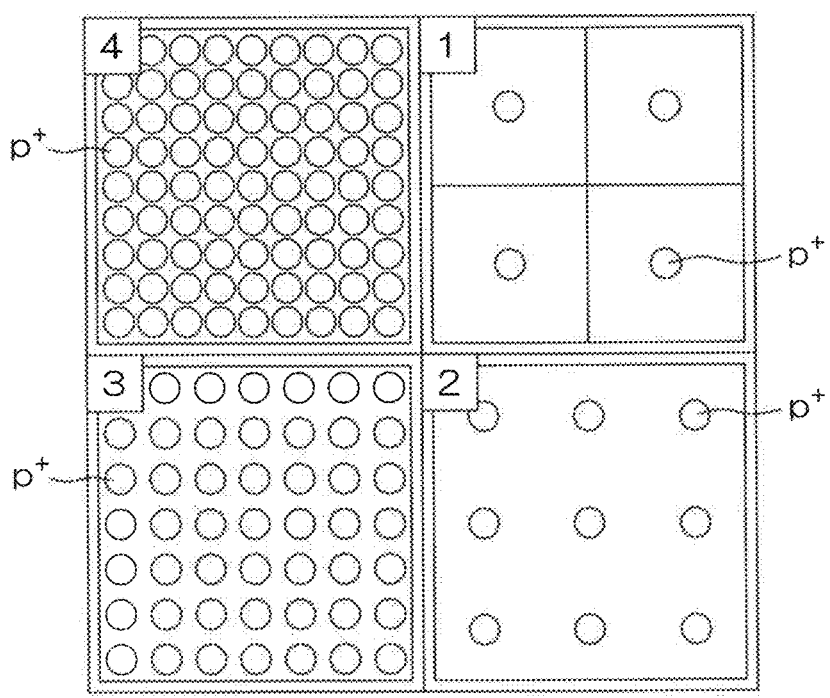
FIG. 18 is a view showing a disposition pattern of a $p^+$ type hole implantation region.

The p⁺ type hole implantation region 16 that contributes to the restraint effect of the voltage ringing can be disposed according to various patterns. The p⁺ type hole implantation region 16 may be disposed in a stripe shape as mentioned above, or may be disposed in a dot shape as shown in FIG. 17 and FIG. 18. If the latter case is employed, the p⁺ type hole implantation region 16 maybe disposed in a single large dot shape as shown in 1 of FIG. 17, or may be disposed in the shape of dots separated from each other as shown in 2 and 3 of FIGS. 17 and 1 to 4 of FIG. 18. The patterns of the p⁺ type hole implantation region 16 shown in FIG. 17 and FIG. 18 are merely examples, and another disposition pattern, such as a zigzag shape, may be employed in addition to the stripe shape mentioned above.

(5) Voltage ringing evaluation by actual device

Next, as a comprehensive test of the evaluation results of (1) to (4) mentioned above, an actual device (Example) according to the pn diode 1 and a device that is a reference example having the same arrangement as the device of Example except for the fact of not having the p⁺ type hole implantation region 16 were produced, and a voltage ringing evaluation was made with respect to these devices. The results are shown in FIG. 19A and FIG. 19B.

Details of each element of the actual device were as follows.

Width of the p⁺ type hole implantation region 16=480 μm
Disposition rate of the p⁺ type hole implantation region 16=20%
Thickness of the n type semiconductor layer 2=123 μm
Disposition pattern of the p⁺ type hole implantation region 16: 25 dot shapes
Electron irradiation (1100 kGy) performed
Additionally, conditions in the voltage ringing evaluation were as follows.
Reverse voltage VR=700 V
Forward current=5 A
Rg=10 ohm
dif/dt=3200 A/μs
Tj=125° C.

Figure 20A:
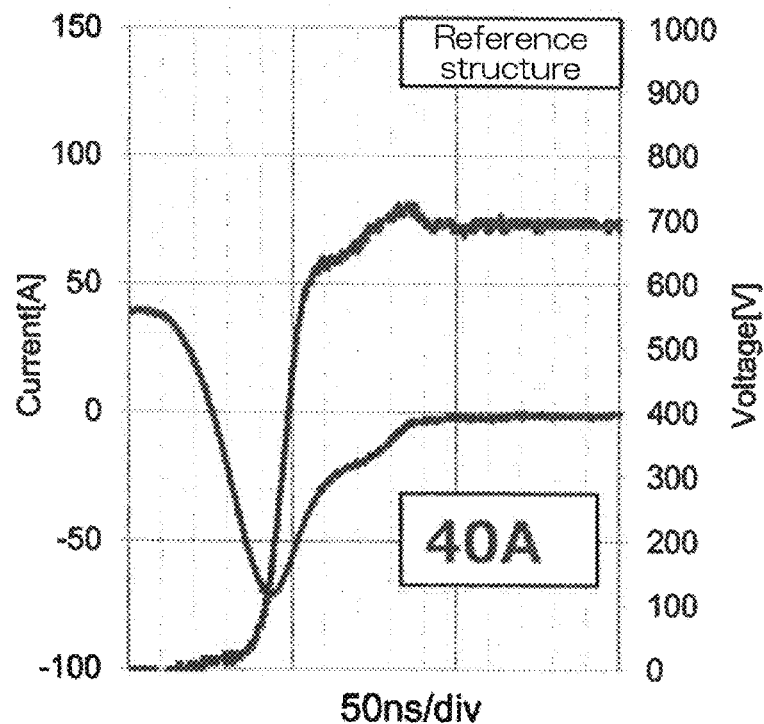
FIG. 20A is a view showing recovery characteristics of a pn diode of a reference example.
Figure 20B:
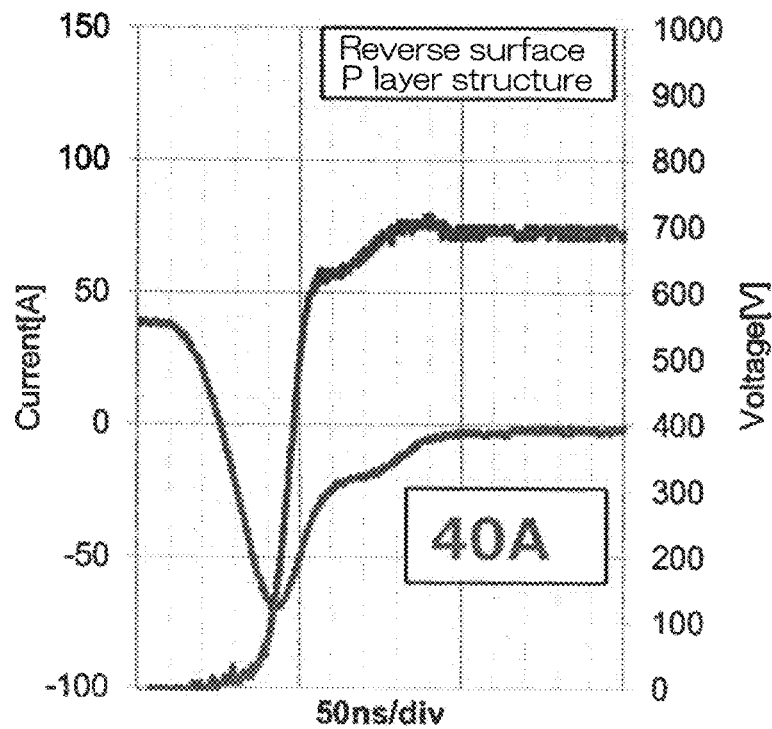
FIG. 20B is a view showing recovery characteristics of a pn diode of Example.
Figure 21A:
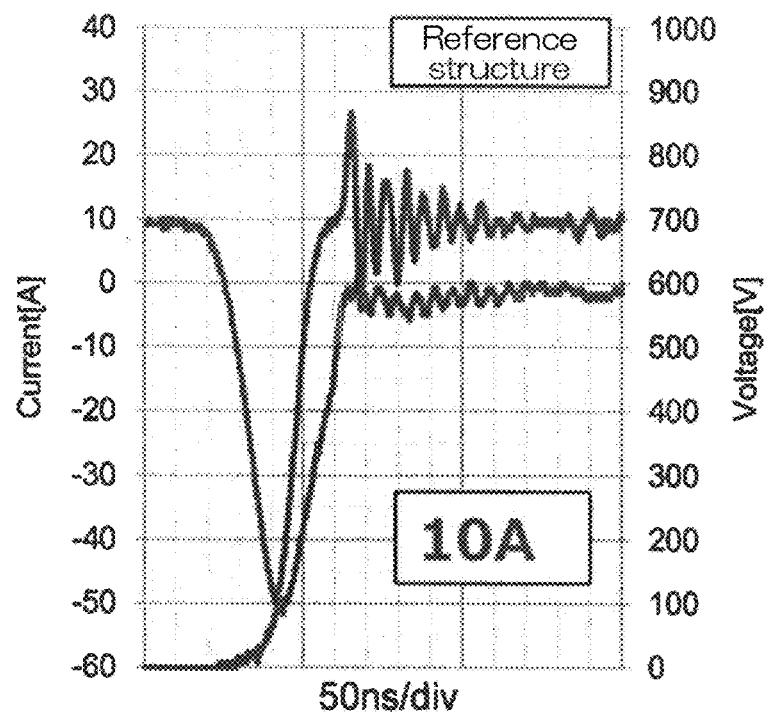
FIG. 21A is a view showing recovery characteristics of a pn diode of a reference example.
Figure 21B:
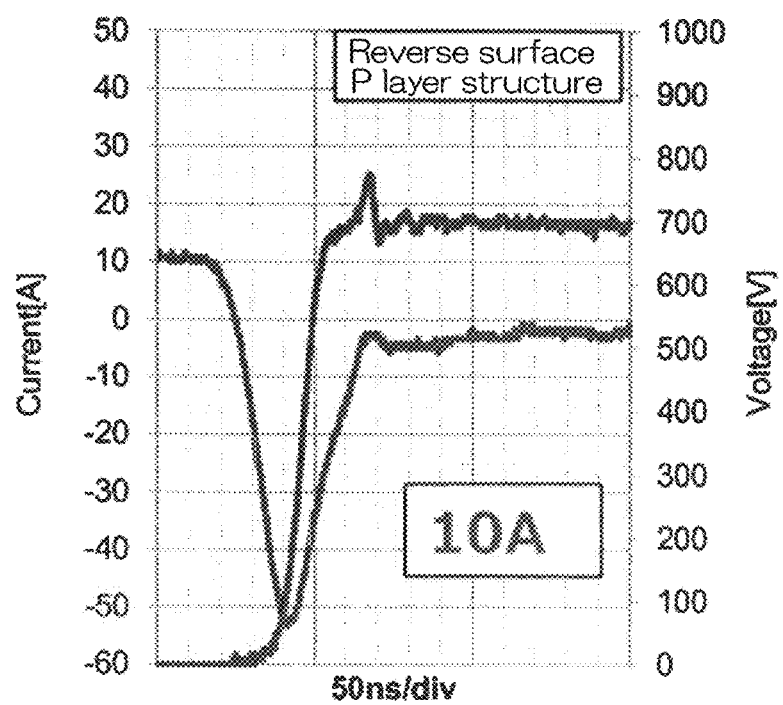
FIG. 21B is a view showing recovery characteristics of a pn diode of Example.
Figure 22A:
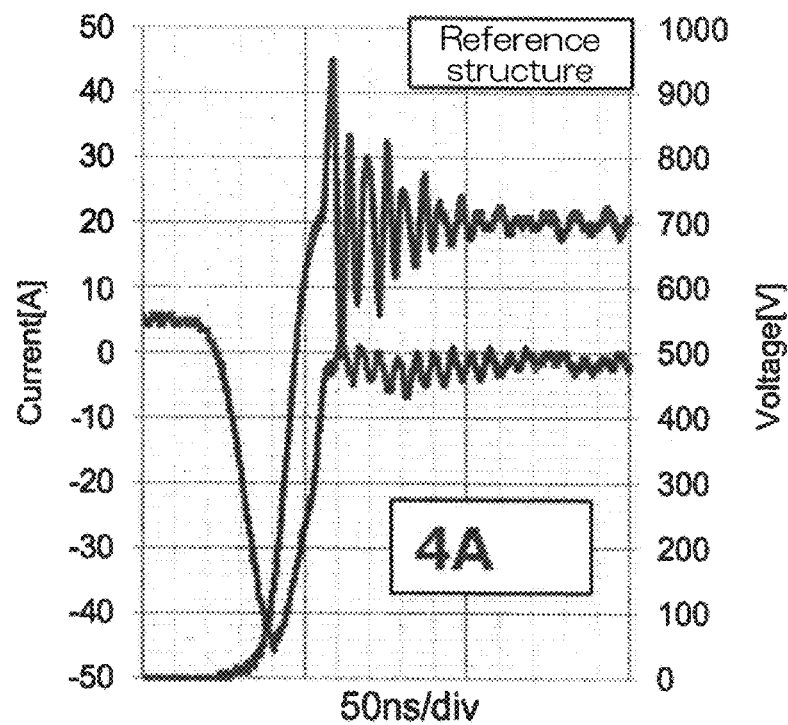
FIG. 22A is a view showing recovery characteristics of a pn diode of a reference example.
Figure 22B:
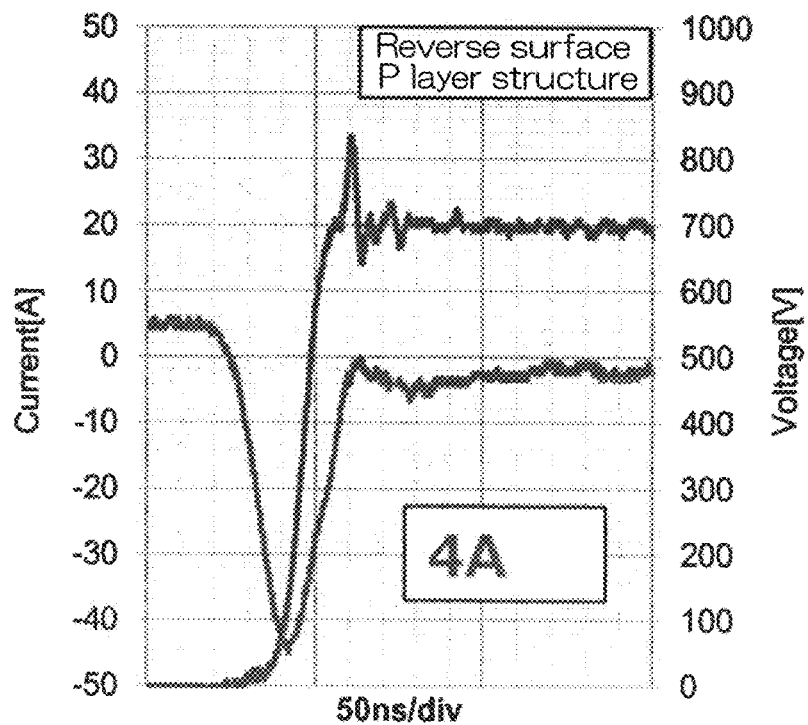
FIG. 22B is a view showing recovery characteristics of a pn diode of Example.
Figure 23:
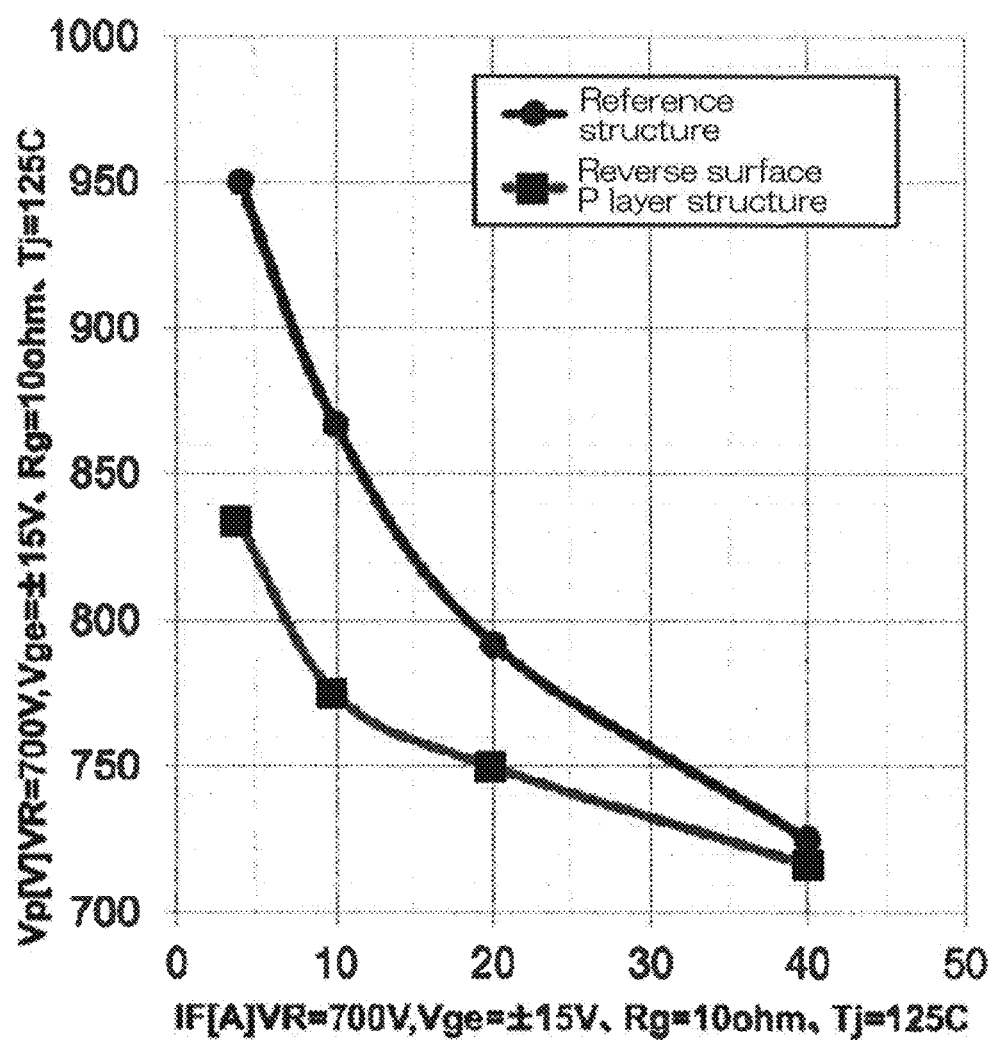
FIG. 23 is a view showing a relationship between a forward current IF and a voltage peak Vp during a switching operation with respect to the reference example and Example.

According to FIG. 19A and FIG. 19B, it has been ascertained that the voltage peak Vp can be reduced by disposing the p⁺ type hole implantation region 16 on the reverse surface part of the pn diode 1 under the aforementioned conditions, and voltage ringing can also be effectively restrained. Likewise, when experiments were performed under the conditions forward current=40 A, forward current=10 A, and forward current=4 A, the decrease of the voltage peak Vp and the restraint effect of voltage ringing have been ascertained under each condition as shown in FIG. 20 to FIG. 22. From these results, FIG. 23 shows a relationship between the forward current IF and the voltage peak Vp during a switching operation.

Although the preferred embodiment of the present invention has been described as above, the present invention can be embodied in other modes.

Although a product having a withstanding pressure class of 1200 V is produced as described in the preferred embodiment, the arrangement and effect of the present invention are applicable even if a different withstanding pressure class, such as a withstanding pressure class of 600 V, is used. Additionally, if a different withstanding pressure class is used, the impurity concentration of each n type semiconductor region and the impurity concentration of each p type semiconductor region become different from those in the ranges mentioned above, and therefore it is recommended to be appropriately changed in accordance with a withstanding pressure class to be used.

Besides, various design changes can be made within the scope of the subject matter described in the patent claims.

What is claimed is:

1. A diode comprising:
    an n type semiconductor layer including an n type cathode layer and an n type drift layer, the n type drift layer having an impurity concentration lower than the n type cathode layer and being disposed on the n type cathode layer;
    a p type anode layer disposed at a surface part of the n type drift layer;
    a field insulating film formed on a part of a surface of the n type semiconductor layer such that the field insulating film is in contact with the n type drift layer and the p type anode layer;
    a p type hole implantation layer selectively disposed at the n type cathode layer;
    an anode electrode electrically connected to the p type anode layer, the anode electrode being in contact with the n type semiconductor layer and the field insulating film; and
    a cathode electrode electrically connected to the n type cathode layer and to the p type hole implantation layer,
    the p type hole implantation layer having a diameter of 20 μm or more,
    the anode electrode having a rear surface facing the n type semiconductor layer, a front surface opposite the rear surface and a side surface connecting the rear surface with the front surface, and
    the side surface of the anode electrode being inclined with respect to a first direction perpendicular to the surface of the n type semiconductor layer.

2. The diode according to claim 1, wherein a disposition rate of the p type hole implantation layer is 20% or more, the disposition rate calculated by (a total area of the p type hole implantation layer)/(a total area of a surface on which the p type hole implantation layer is formed)×100 (%).

3. The diode according to claim 2, wherein the disposition rate of the p type hole implantation layer is 20% to 25%.

4. The diode according to claim 1, wherein the n type semiconductor layer has a thickness of 115 μm or more.

5. The diode according to claim 1, wherein the p type hole implantation layer has an impurity concentration of $1\times10^{18}$ cm⁻³ to $1\times10^{19}$ cm⁻³.

6. The diode according to claim 1, further comprising an n type buffer layer that is disposed between the n type cathode layer and the n type drift layer and that has an impurity concentration lower than the n type cathode layer and higher than the n type drift layer.

7. The diode according to claim 6, wherein the n type drift layer has an impurity concentration of $5\times10^{12}$ cm⁻³ to $5\times10^{14}$ cm⁻³, the n type cathode layer has an impurity concentration of $1\times10^{18}$ cm⁻³ to $5\times10^{20}$ cm⁻³, and the n type buffer layer has an impurity concentration of $5\times10^{15}$ cm⁻³ to $1\times10^{17}$ cm⁻³.

8. The diode according to claim 1, wherein the n type drift layer includes an active region in which the p type anode layer is chiefly disposed and an outer peripheral region that surrounds the active region, and
the p type hole implantation layer is disposed at least so as to face the active region.

9. The diode according to claim 8, wherein a p type Field Limiting Ring structure disposed at the surface part of the n type drift layer is included in the outer peripheral region, and
the p type hole implantation layer is disposed so as not to face the p type Field Limiting Ring structure.

10. The diode according to claim 1, further comprising a crystal defect formed in substantially a whole of the n type drift layer.

11. The diode according to claim 1, wherein the p type hole implantation layer has a dot shape.

12. The diode according to claim 11, wherein a plurality of p type hole implantation layers each of which has the dot shape are disposed so as to be separated from each other.

13. A diode comprising:
an n type semiconductor layer including an n type cathode layer and an n type drift layer, the n type drift layer having an impurity concentration lower than the n type cathode layer and being disposed on the n type cathode layer;
a p type anode layer disposed at a surface part of the n type drift layer;
a field insulating film formed on a part of a surface of the n type semiconductor layer such that the field insulating film is in contact with the n type drift layer and the p type anode layer;
a p type hole implantation layer selectively disposed at the n type cathode layer, the p type hole implantation layer having a stripe shape;
an anode electrode electrically connected to the p type anode layer, the anode electrode being in contact with the n type semiconductor layer and the field insulating film; and
a cathode electrode electrically connected to the n type cathode layer and to the p type hole implantation layer,
the p type hole implantation layer having a width of 20 µm or more,
the anode electrode having a rear surface facing the n type semiconductor layer, a front surface opposite the rear surface and a side surface connecting the rear surface with the front surface, and
the side surface of the anode electrode being inclined with respect to a first direction perpendicular to the surface of the n type semiconductor layer.

14. A diode comprising:
a semiconductor layer having a front surface and a rear surface opposite the front surface, the semiconductor layer including a first impurity region of a first conductivity type exposed from the front surface, a plurality of second impurity regions of the first conductivity type exposed from the rear surface and a third impurity region of a second conductivity type different from the first conductivity type exposed from both the front surface and the rear surface, the third impurity region surrounding the first impurity region and the plurality of second impurity regions;
a first insulating layer formed on a part of the front surface of the semiconductor layer such that the first insulating layer is in contact with the first impurity region and the third impurity region;
a first electrode continuously formed on both the semiconductor layer and the first insulating layer, the first electrode having a first surface facing the semiconductor layer, a second surface opposite the first surface and a third surface connecting the first surface with the second surface;
a second electrode formed on the rear surface of the semiconductor layer such that the second electrode is in contact with the second impurity region and the third impurity region; and
the third surface of the first electrode being inclined with respect to a first direction perpendicular to the front surface of the semiconductor layer.

15. The diode according to claim 14, further comprising:
a Field Limiting Ring structure of the first conductivity type formed on the front surface part of the semiconductor layer; and
a third electrode formed on the first insulating layer and connected to the Field Limiting Ring, the third electrode having a first surface facing the semiconductor layer, a second surface opposite the first surface and a third surface connecting the first surface with the second surface, wherein
the second surface of the third electrode is provided with a recess portion, and
the third surface of the third electrode is inclined with respect to the first direction.

16. The diode according to claim 15, wherein
the diode comprises a plurality of the Field Limiting Rings,
the first insulating layer has a contact hole from which one of the Field Limiting Rings is exposed,
a fourth electrode is continuously formed on both the first insulating layer and the one of the Field Limiting Rings exposed from the contact hole, and
a distance between the front surface of the semiconductor layer in the contact hole and a surface of the fourth electrode is shorter than a distance between the front surface of the semiconductor layer covered with the first insulating layer and the surface of the fourth electrode.

17. The diode according to claim 14, wherein
the semiconductor layer has a fourth impurity region of the second conductivity type which has a impurity concentration higher than that of the third impurity region, the fourth impurity region exposed from the front surface of the semiconductor layer,
a third electrode continuously formed on both the fourth impurity region and the first insulating layer, the fourth electrode having a first surface facing the semiconductor layer, a second surface opposite the first surface and a third surface connecting the first surface with the second surface;
the third surface of the fourth electrode being inclined with respect to the first direction.

18. The diode according to claim 14, further comprising a second insulating layer formed on the first insulating layer such that the second insulating layer covers a part of the first electrode, wherein
the first insulating layer has a contact hole from which the first impurity region is partly exposed,
the second insulating layer has an opening from which the first electrode is partly exposed, and
a peripheral edge of the contact hole of the first insulating layer is disposed outside a peripheral edge of the opening of the second insulating layer.

* * * * *